(12) United States Patent
Koike

(10) Patent No.: US 8,659,953 B2
(45) Date of Patent: Feb. 25, 2014

(54) SEMICONDUCTOR MEMORY DEVICE

(75) Inventor: Tsuyoshi Koike, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/403,001

(22) Filed: Feb. 23, 2012

(65) Prior Publication Data
US 2012/0147680 A1 Jun. 14, 2012

Related U.S. Application Data

(63) Continuation of application No. PCT/JP2010/004547, filed on Jul. 13, 2010.

(30) Foreign Application Priority Data

Sep. 2, 2009 (JP) .................. 2009-202414

(51) Int. Cl.
*G11C 5/14* (2006.01)
*G11C 7/00* (2006.01)

(52) U.S. Cl.
USPC .................. 365/189.011; 365/226

(58) Field of Classification Search
USPC ........................... 365/189.11, 226
See application file for complete search history.

(56) References Cited

U.S. PATENT DOCUMENTS

| | | | |
|---|---|---|---|
| 6,242,948 B1 | 6/2001 | Makino | |
| 6,333,877 B1 | 12/2001 | Nagaoka et al. | |
| 7,643,350 B2 * | 1/2010 | Sugawara | 365/185.24 |
| 2002/0006069 A1 * | 1/2002 | Kokubo et al. | 365/227 |
| 2003/0002329 A1 | 1/2003 | Wong | |
| 2003/0076705 A1 | 4/2003 | Yamaoka et al. | |
| 2004/0125681 A1 | 7/2004 | Yamaoka et al. | |
| 2006/0164905 A1 | 7/2006 | Furuta et al. | |
| 2007/0274124 A1 | 11/2007 | Otsuka | |
| 2008/0291754 A1 | 11/2008 | Nakai et al. | |
| 2009/0141569 A1 * | 6/2009 | Nii et al. | 365/189.16 |
| 2009/0172451 A1 * | 7/2009 | Joshi et al. | 713/324 |

FOREIGN PATENT DOCUMENTS

| | | |
|---|---|---|
| JP | 02-268351 | 11/1990 |
| JP | 06-075860 | 3/1994 |
| JP | 06-275076 | 9/1994 |
| JP | 10-112188 | 4/1998 |
| JP | 2001-167585 | 6/2001 |

(Continued)

OTHER PUBLICATIONS

Yamaoka, M. et al. "A 300MHz 25 μA/Mb Leakage On-Chip SRAM Module Featuring Process-Variation Immunity and Low-Leakage-Active Mode for Mobile-Phone Application Processor." in 2004 IEEE International Solid-State Circuits Conference, 2004, ISSCC 2004/Session 27/ SRAM/ 27.2.

(Continued)

*Primary Examiner* — Hoai V Ho
*Assistant Examiner* — Tri Hoang
(74) *Attorney, Agent, or Firm* — McDermott Will & Emery LLP

(57) ABSTRACT

A power supply control circuit which can cut off a power supply independently is provided for each column in a memory cell array. The power supply control circuit is controlled by a circuit which is provided for each column and determines whether or not it is necessary to hold information, whereby a power supply for a memory cell which does not need to hold information is cut off.

13 Claims, 19 Drawing Sheets

(56) References Cited

FOREIGN PATENT DOCUMENTS

| | | |
|---|---|---|
| JP | 2001-195893 | 7/2001 |
| JP | 2002-279786 | 9/2002 |
| JP | 2003-022677 | 1/2003 |
| JP | 2003-045189 | 2/2003 |
| JP | 2003-132683 | 5/2003 |
| JP | 2004-206745 | 7/2004 |

OTHER PUBLICATIONS

International Search Report of PCT Application No. PCT/JP2010/004547, dated Oct. 19, 2010.

* cited by examiner

SEMICONDUCTOR MEMORY DEVICE

CROSS-REFERENCE TO RELATED APPLICATIONS

This is a continuation of PCT International Application PCT/JP2010/004547 filed on Jul. 13, 2010, which claims priority to Japanese Patent Application No. 2009-202414 filed on Sep. 2, 2009. The disclosures of these applications including the specifications, the drawings, and the claims are hereby incorporated by reference in their entirety.

BACKGROUND

The present disclosure relates to semiconductor memory devices, and more particularly, to the control of a power supply for a memory cell.

The advance in miniaturization of semiconductor manufacturing processes has led to a serious increase in leakage current. In addition, the leakage current problem tends to be more serious due to the reduction in the threshold voltage of a transistor and the increased capacity of an on-chip memory for meeting a demand for higher speed.

The leakage current is roughly divided into a gate leakage current, a junction leakage current, a subthreshold current, etc. The gate leakage current is a current which flows from the gate electrode through the gate insulating film to the silicon substrate in a metal-oxide-semiconductor (MOS) transistor. The junction leakage current is a current which flows from the drain electrode to the substrate. The subthreshold current is a current which flows between the drain electrode and the source electrode when the MOS transistor is off.

There are known techniques of reducing the leakage current in conventional static random access memory (SRAM) devices, such as the technique of applying a back-bias voltage to the substrate of a memory cell in the standby mode, the technique of boosting the VSS power supply to a memory cell to increase the threshold voltage of a memory cell transistor, etc. (see M. Yamaoka et al., "A 300 MHz 25 µA/Mb Leakage On-Chip SRAM Module Featuring Process-Variation Immunity and Low-Leakage-Active Mode for Mobile-Phone Application Processor," ISSCC Dig. Tech. Papers, paper 27.2, February 2004).

In the above conventional techniques, if the voltage of the VSS power supply line is excessively boosted, data stored in a memory cell is destroyed. Therefore, in general systems, the voltage of the VSS power supply line is only allowed to increase to a level at which data of a memory cell is not destroyed, and therefore, there is a limit on the amount of the leakage current which can be blocked.

SUMMARY

The present disclosure describes implementations of a technique of reducing the leakage current in a memory cell array by cutting off or performing a low-power consumption standby control on a power supply for a memory cell of the memory cell array which does not need to hold information.

According to the present disclosure, in a memory cell array, memory cells are each classified into one which needs to hold data or one which does not need to hold data. A power supply for a memory cell which does not need to hold data may be cut off during the standby mode and the active mode, or a high-level power supply may be set to a level lower than a normal level or a low-level power supply may be set to a level higher than a normal level, whereby the leakage current can be significantly reduced.

In the present disclosure, a power supply control is performed at a functional level, such as a row or a column, in a memory cell array, whereby a fine-grained low-power control can be achieved. In other words, in the configuration of the present disclosure, a power supply control is performed in units smaller than in the conventional art, whereby the leakage current can be reduced to a considerably greater extent. In addition, means for determining whether or not a memory cell holds necessary data, and a power supply control circuit which operates based on the determination result, are provided for each of separate power supplies. The example configuration of the present disclosure is highly suitable for practical use because of a smaller area overhead and a smaller timing overhead.

Examples of the memory cell which does not need to hold data include a memory cell storing duplicate data, a memory cell storing invalid data, a memory cell in a column or row in which write operation has not been performed, a memory cell in a column which is not used for the system, etc.

If ways of a cache memory used by a program are not uniform, data accesses are not uniform in a memory, or stored data, such as data in a register file etc., is biased in a memory, data is mostly duplicate or unused, and therefore, the leakage current is further reduced by the present disclosure.

A valid bit can be used to determine whether or not data of a way is required in a cache memory, and therefore, advantages can be obtained without providing a complicated control unit.

Representative embodiments of the present disclosure will be briefly described hereinafter.

In a representative embodiment of the present disclosure, in a memory cell array in which a plurality of memory cells are connected together in a matrix, a separate power supply is provided for each column, and a power supply control circuit which controls a power supply is provided for each column. Moreover, a match detection circuit which detects that data values stored in memory cells provided in a column are equal to each other, and a representative value storage circuit which outputs data detected by the match detection circuit to a read circuit in the column, are provided for each column. During transition to the standby mode of the system or during a cycle in which there is no access to the memory, the match detection circuit detects whether or not duplicate data is stored in memory cells provided in a column. If data values stored in all memory cells provided in a column are the same, a power supply for the memory cells in the column is cut off, and instead the representative value storage circuit stores data which has been stored in the memory cells in the column. When there is an access to the column, the representative value storage circuit outputs the data. Moreover, not only the power supply for the memory cells, but also a power supply for a peripheral circuit for the column, are cut off, or a high-level power supply is set to a level lower than a normal level or a low-level power supply is set to a level higher than a normal level, whereby the leakage current can be further reduced. When a portion of the read circuits is used to perform match determination, then if the match determination and the power supply control are performed on memory cells which output using the same output circuit, the area can be reduced.

The present disclosure can be expected to provide particularly significant advantages for a large-capacity memory cell array, a memory cell array employing transistors having a low threshold voltage for increasing speed, and a memory cell array having a long standby period. Moreover, significant advantages can be expected for memory cells having biased data, such as data in a register file which stores data most of which is low, etc.

Each column may be subdivided into banks, and match determination may be performed on a bank-by-bank basis. In this case, a finer-grained power supply control can be performed, whereby the leakage current can be more effectively reduced in memory cells.

Alternatively, in order to reduce the area, match determination may be simultaneously performed on a plurality of columns to perform a power supply control. Moreover, the circuit which stores a representative value of a column may be a latch for holding output data or a latch-type sense amplifier, whereby the overhead of the number of circuit parts can be reduced.

Next, a second representative embodiment of the present disclosure will be described. Recently, in an increasing number of SRAM devices, a read circuit is provided in which a transistor whose gate is connected to a data holding node of a memory cell and a transistor whose gate is connected to a read word line are connected in series between a data line and a ground, in order to increase the speed and reduce or prevent destruction of data in SRAM during read operation. During read operation of the memory cell thus configured, when one of the storage nodes of the memory cell is high, charge is extracted from the data line precharged to a high level at the same time when a word line is selected, and when the storage node is low, the data line is maintained at the precharged high level. Therefore, in a memory cell array including such a memory cell, even when a plurality of read word lines are simultaneously activated, data in the memory cell is not destroyed. When a plurality of read word lines are simultaneously activated, then the data holding node of at least one of memory cells connected to the same data line is high, the read data line is discharged. Conversely, only when data values stored in all memory cells are low, the bit line is maintained at the high level. As a result, it is possible to determine whether or not the data values of all memory cells connected to the same data line are low. By using the above mechanism, data match determination can be performed during one cycle, whereby a period of time and power for performing data determination can be reduced. Also, a multiple selection decoder for performing data match determination can be implemented by adding a small circuit to a conventional decoder, and if the match detection circuit employs a read circuit, the overhead of the number of circuit parts can be reduced.

When a plurality of read word lines are simultaneously selected to determine whether or not the data values of all memory cells connected to the same data line are the same, match determination may not be performed on a column of memory cells originally storing invalid data. In order to determine that data stored in a memory cell is invalid, information stored in a valid memory cell indicating that information of the word is invalid is used, for example. In other words, match determination may be performed while a word line of memory cells in a word storing invalid data is not activated. A representative example which stores information indicating that data in a row is valid is a valid bit memory cell of a cache memory.

Next, a third representative embodiment of the present disclosure will be described. If it is detected that data values of all memory cells in a valid bit column are low, it is known that all data values of a tag macro and a data macro of a way of a cache memory corresponding to the valid bit are invalid. As a result, the match detection circuit is provided in a valid memory of a cache memory, and power supplies for a tag macro and a data macro of the corresponding way are controlled by an output of the match detection circuit, whereby the leakage current can be effectively reduced when a way is not used or in a way which does not have valid data. This technique is advantageous in terms of the complexity and area of signal interconnects because a special power supply control unit for a power supply control is not required.

If a valid bit of each way is divided into a plurality of blocks and a similar control is performed, a finer-grained power supply control can be performed, whereby the leakage current can be further reduced.

The present disclosure is also applicable to a memory cell which stores other special information. For example, as the memory cell which stores the special information, a memory cell which stores access history, such as a least recently used (LRU) array etc., can be used. As another example, the special information storage memory cell provided for each word may be a memory cell which stores information indicating a word in which a defect has been detected in a built-in self test (BIST), whereby similar advantages are obtained.

A fourth representative embodiment of the present disclosure will be described. While, in the above representative examples, a power supply for each memory cell column is controlled by the data match detection circuit, in the fourth embodiment the power supply is controlled by a valid information storage circuit which stores information indicating that the bit is valid. As a result, a power supply for a column which is not used for the system can be turned off, whereby the leakage current of a memory cell can be reduced no matter whether it is during the standby mode or the active mode. The area of the valid information storage circuit can be reduced by using one line (row) of memory cells in the memory cell array.

Next, a fifth representative embodiment of the present disclosure will be described. If write operation has not been performed on a bit since the system was started up, data of a memory cell stored in the bit is invalid, and therefore, does not need to be held. Therefore, for example, if a write detection circuit which detects that write operation has been performed is provided for each bit, and a power supply for a memory cell of the bit and a power supply for a peripheral circuit of the bit are turned on only after the write detection circuit detects write operation, the useless leakage current can be reduced.

Even when write operation is performed, then if write data is the same as data stored in the representative value storage circuit provided in the read section, and there is a read access to the bit, the data may be read out from the representative value storage circuit. Therefore, a power supply for a memory cell of the bit does not need to be turned on. When write data is different from data stored in the representative value storage circuit, memory cells in the column may be reset, and the different data may be written to the desired memory cell, whereby normal operation for the system can be performed. With such a configuration, the useless leakage current can be further reduced.

A write data determination circuit may be provided in a memory cell array for storing a valid bit of a cache memory. If the write data determination circuit is controlled so that if data which is high is not written to the valid bit, power supplies for a tag macro and a data macro of the corresponding way are not turned on, whereby a leakage current flowing through a way which does not contain valid information can be reduced.

If a valid bit of each way is divided into a plurality of groups and a similar control is performed, a finer-grained power supply control can be performed, whereby the leakage current can be further reduced.

In the above description, a valid bit is an example of the valid information storage circuit. Alternatively, the present disclosure is also applicable to a memory cell storing other information.

Next, a sixth representative embodiment of the present disclosure will be described. A separate power supply for a memory cell array in a tag macro and a data macro of a cache memory is provided for each row, and a power supply control circuit which controls a power supply is provided for each row. When a valid bit of the cache memory stores information indicating that data is invalid, the data of the corresponding row of the tag macro and the data macro is invalid. Therefore, if power supplies for the tag macro and the data macro of the corresponding row are controlled based on data stored in the valid bit, the useless leakage current can be reduced.

Next, a seventh representative embodiment of the present disclosure will be described. A separate power supply for a memory cell array in a tag macro and a data macro of a cache memory is provided for each row, and a power supply control circuit which controls a power supply is provided for each row. Data stored in memory cells in a row in the memory cell array in which written operation has not been performed since the system was started up is invalid. Therefore, if a write detection circuit is provided for each row and, for example, a power supply for a row is not turned on until write operation has been detected, the useless leakage current can be reduced.

Finally, an eighth representative embodiment of the present disclosure will be described. In a device which includes a first and a second storage circuit connected to each other, if data stored in the second storage circuit indicates that the first storage circuit does not need to hold data, a power supply for the first storage circuit is cut off, or a low-power consumption standby control is performed on the power supply, based on the data stored in the second storage circuit. As a result, the useless leakage current in the second storage circuit can be reduced.

According to the present disclosure, a power supply for a memory cell which does not need to hold data in a memory cell array can be cut off, or an ultra low-power standby control can be performed on the power supply, whereby standby power can be significantly reduced, and the leakage current during operation can be reduced. As a result, the threshold voltage of a transistor can be reduced in order to increase the speed and the memory capacity can be increased in order to improve the performance, within the acceptable range of power specifications of a predetermined system.

DETAILED DESCRIPTION

Embodiments of the present disclosure will be described hereinafter in detail with reference to the accompanying drawings. Note that the embodiments described below are only for illustrative purposes and are not intended to limit the present disclosure.

<<First Embodiment>>

Figure 1:
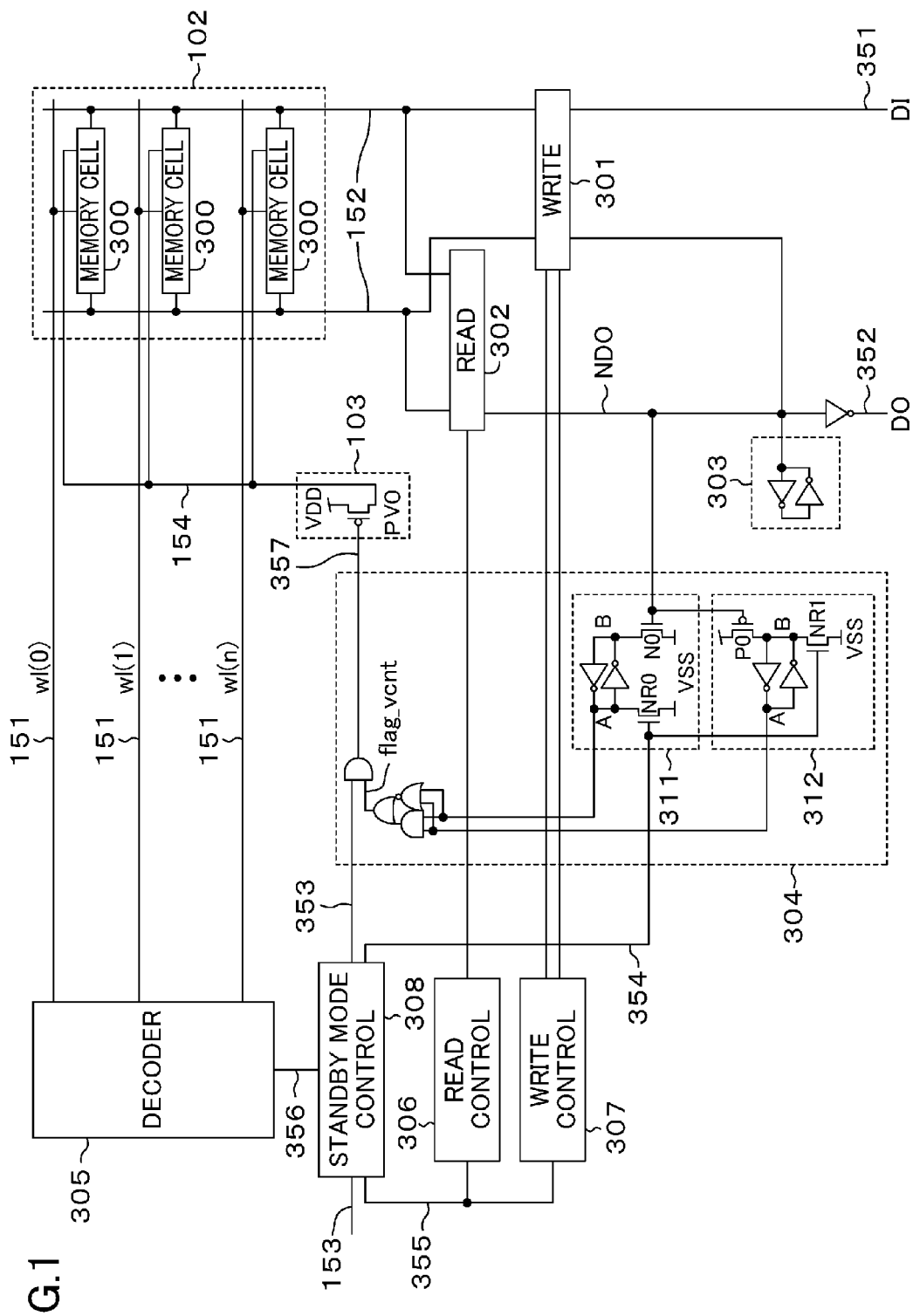
FIG. 1 is a circuit diagram schematically showing a semiconductor memory device according to a first embodiment of the present disclosure.
Figure 2:
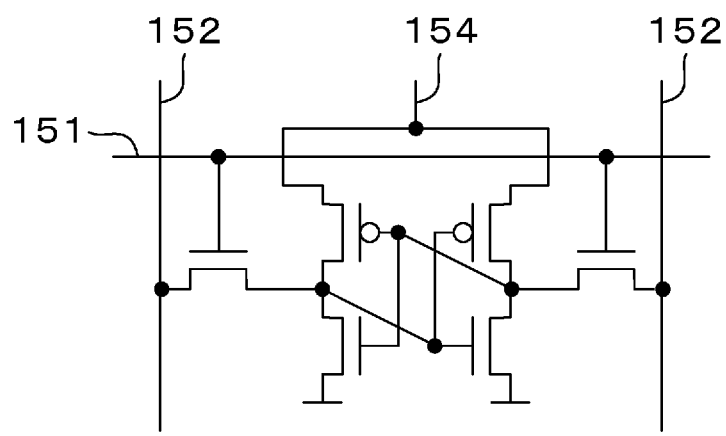
FIG. 2 is a circuit diagram showing a detailed configuration of a memory cell of FIG. 1.

FIGS. 1 and 2 are circuit diagrams in a first embodiment of the present disclosure. A semiconductor memory device of FIG. 1 includes a memory cell array 102 in which a plurality of memory cells 300 are arranged in a matrix. Note that FIG. 1 shows only one column of memory cells 300. A reference character 151 indicates (n+1) word lines wl(0)-wl(n) (n is a positive integer), a reference character 152 indicates a pair of bit lines, and a reference character 154 indicates a memory cell power supply line. Any of (n+1) word lines 151 is selected by a decoder 305. A reference character 308 indicates a standby mode control circuit, a reference character 306 indicates a read control circuit, a reference character 307 indicates a write control circuit, a reference character 301 indicates a write circuit, a reference character 302 indicates a read circuit, a reference character 351 indicates an input data line DI, and a reference character 352 indicates an output data line DO.

The memory cell power supply line 154 is divided into separate lines, one for each bit. A power supply control circuit 103, a match detection circuit 304, and a representative value storage circuit 303 are provided for each bit. The power supply line 154 is connected to an output of the power supply control circuit 103. The power supply control circuit 103 receives an output of the match detection circuit 304. The match detection circuit 304 includes an all-zero latch 311 and an all-one latch 312.

Operation of the circuit of FIG. 1 will be described. A power supply control in the standby mode is performed when a standby mode control signal 153 is asserted. When the standby mode control signal 153 is asserted, the standby mode control circuit 308 issues a reset signal 354, so that the all-zero latch 311 and the all-one latch 312 are reset. Specifically, the all-zero latch 311 is reset by a transistor NR0 connected to a VSS power supply so that a storage node A goes low, and the all-one latch 312 is reset by a transistor NR1 so that a storage node A goes high. In order to detect a match between data values stored in all memory cells 300 provided in a column, it is necessary to successively select and read all word lines 151. To do so, the standby mode control circuit 308, when receiving the standby mode control signal 153, counts up the address, and outputs a decoder count up/down signal 356 to the decoder 305. As a result, the word lines 151 are successively selected, and read data is successively output to the bit lines 152. In this case, the standby mode control circuit 308 outputs an internal standby mode control signal 355 to the read control circuit 306, which then controls the the read circuit 302 which reads data from the bit lines 152.

When data is successively read from the memory cells 300 provided in the column and then transmitted on a data line NDO, the all-zero latch 311 and the all-one latch 312 are rewritten by the transistor N0 and P0, respectively, depending on the state of the data line NDO at that time. If data stored in the memory cell 300 is high, the data line NDO is low. If data stored in the memory cell 300 is low, the data line NDO is high. In a series of read operations, if the data line NDO goes low once, the transistor P0 causes the storage nodes A and B of the all-one latch 312 to go low and high, respectively. Conversely, if the data line NDO goes high once, the transistor N0 causes the storage nodes A and B of the all-zero latch 311 to go high and low, respectively. Changes in the data line NDO, the all-zero latch 311, and the all-one latch 312 in a series of read cycles for match determination are summarized as follows.

(1) When all data values are low, the storage nodes A of the all-zero latch 311 and the all-one latch 312 are both high.

(2) When all data values are high, the storage nodes A of the all-zero latch 311 and the all-one latch 312 are both low.

(3) When some data value(s) are low and the other data value(s) are high, the storage node A of the all-zero latch 311 is high and the storage node A of the all-one latch 312 is low.

In the cases (1) and (2), the power supply can be cut off, so that the representative value storage circuit 303 stores a representative value of data stored in the bit. In the case (3), the power supply is not cut off. The power supply is cut off with the following timing. After all word lines have been completely read and the determination has been completed in the match detection circuit 304, the standby mode control circuit 308 causes the flag determination enable signal 353 to go from low to high, whereby it is determined whether a flag determination result signal 357 is low or high, depending on the state of a flag signal flag_vcnt at that time. As a result, a transistor PV0 which is included in the power supply control circuit 103 and is connected to a VDD power supply is controlled to switch on and off the memory cell power supply line 154.

When the standby mode ends, the standby mode control signal 153 is negated, the data stored in the representative value storage circuit 303 needs to be written back to the memory cells 300 in a bit column (i.e., the memory cells 300 are refilled) for a bit for which the power supply is cut off. Initially, the address is incremented by the standby mode control circuit 308, and at the same time, the write control circuit 307 is controlled so that the write circuit 301 operates.

For a bit for which the power supply is cut off, the write control circuit 307 is enabled, so that the data stored in the representative value storage circuit 303 is written to the memory cells 300. For a bit on which the power supply control is not performed, the write circuit 301 is negated, and therefore, write operation is not performed on the memory cells 300.

The memory cells 300 may be refilled and the word lines 151 may be successively selected using various circuit configurations. The present disclosure may encompass any other configurations that can determine whether or not there is duplicate information in memory cells, and based on the determination result, switch on and off a power supply for the memory cells.

Although, in the example of FIG. 1, the VDD power supply is controlled, the VSS power supply may be controlled, which is encompassed by the present disclosure.

In the example of FIG. 1, the two bit lines 152 which are controlled by a precharge circuit (not shown) are used for read operation. Alternatively, in some circuit in which a single bit line which is controlled by a precharge circuit is used for read operation, the data line NDO is temporarily reset before data is read from the memory cells 300. In such a case, the transistors N0 and P0 need to be masked so that the transistors N0 and P0 are not switched on during the reset mode.

In the technique of FIG. 1, the same number of cycles as there are the word lines 151 are required to write the data of the representative value storage circuit 303 back to the memory cells 300 when the power supply is enabled again after the cut-off state. Alternatively, the memory cells 300 may be simultaneously rewritten by providing a reset transistor to the memory cell 300. In the case of FIG. 1, two additional transistors are required to cause the data of the memory cell 300 to be low or high, leading to an increase in the area of the memory cell 300.

Figure 3:
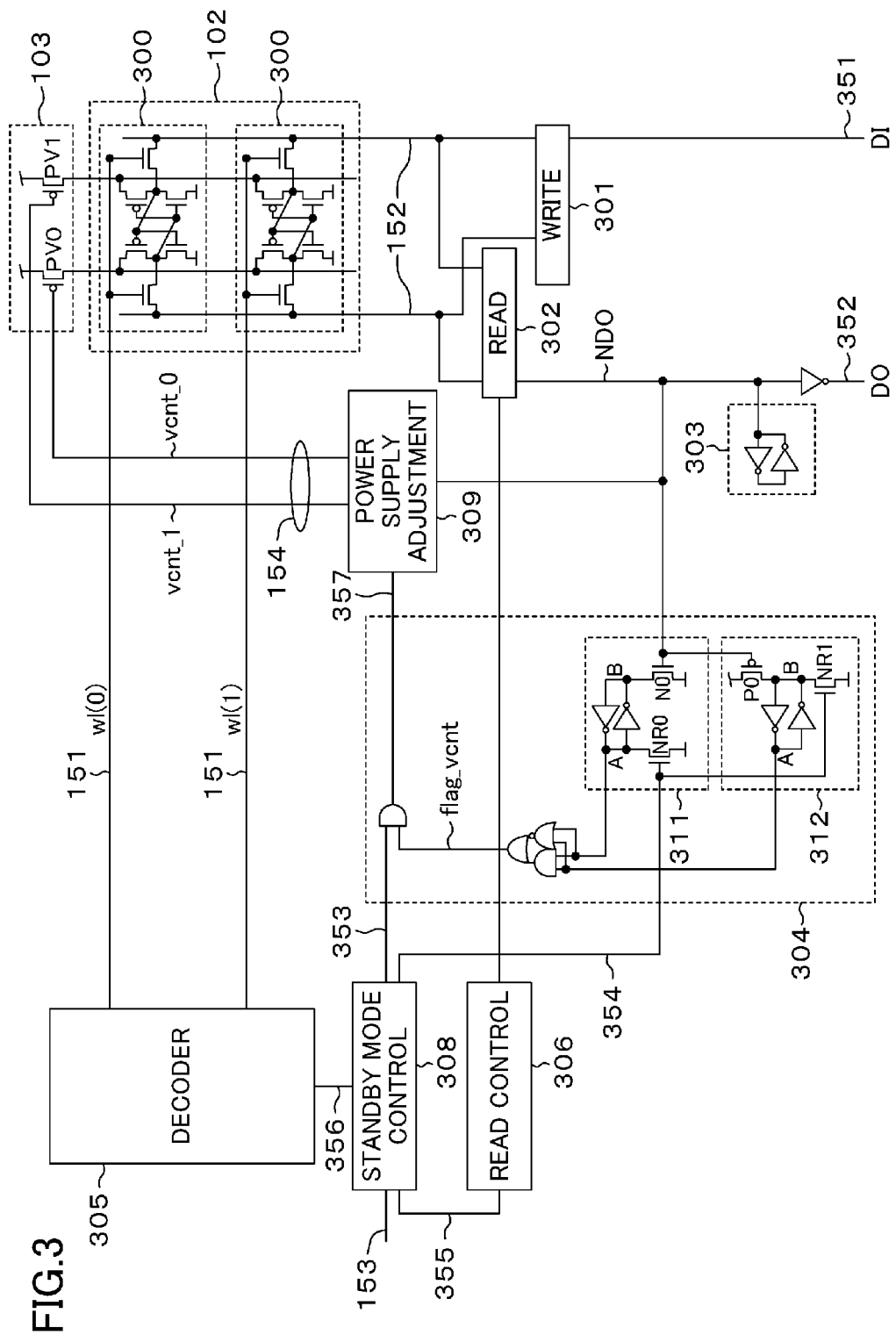
FIG. 3 is a circuit diagram showing a first variation of the semiconductor memory device of FIG. 1.

FIG. 3 shows an example circuit for overcoming this problem. In FIG. 3, a reference character 309 indicates a power supply adjustment circuit. A power supply control circuit 103 includes two transistors PV0 and PV1. The power supply adjustment circuit 309 supplies a power supply control signal vcnt_0 to the transistor PV0 and a power supply control signal vcnt_1 to the transistor PV1.

The circuit of FIG. 3 operates in a manner which is similar to that of the circuit of FIG. 1, except for a refilling technique. A refilling technique for the circuit of FIG. 3 will be described. Two separate VDD power supplies are provided. One VDD power supply supplies power to one of two inverters included in the memory portion of the memory cell 300, and the other VDD power supply supplies power to the other inverter. The power supplies corresponding to the memory cells 300 adjacent to each other in the column direction are connected together. When the memory cell 300 is refilled after the end of the standby mode, the two VDD power supplies are turned on with different timings using the power supply adjustment circuit 309, whereby the memory cells 300 in a column can be simultaneously reset either high or low. The order in which the power supplies are turned on is determined based on data stored in the representative value storage circuit 303.

The VSS power supply may be controlled in a similar manner. In general, however, adjacent memory cells share a common VSS power supply, and therefore, it is not very appropriate to perform refilling using the VSS power supply.

Note that, in FIG. 3, if all data values stored in the memory cells 300 provided in the column are either low or high, the match detection circuit 304 and the circuits 303 and 309 for refilling can be simplified.

Figure 4:
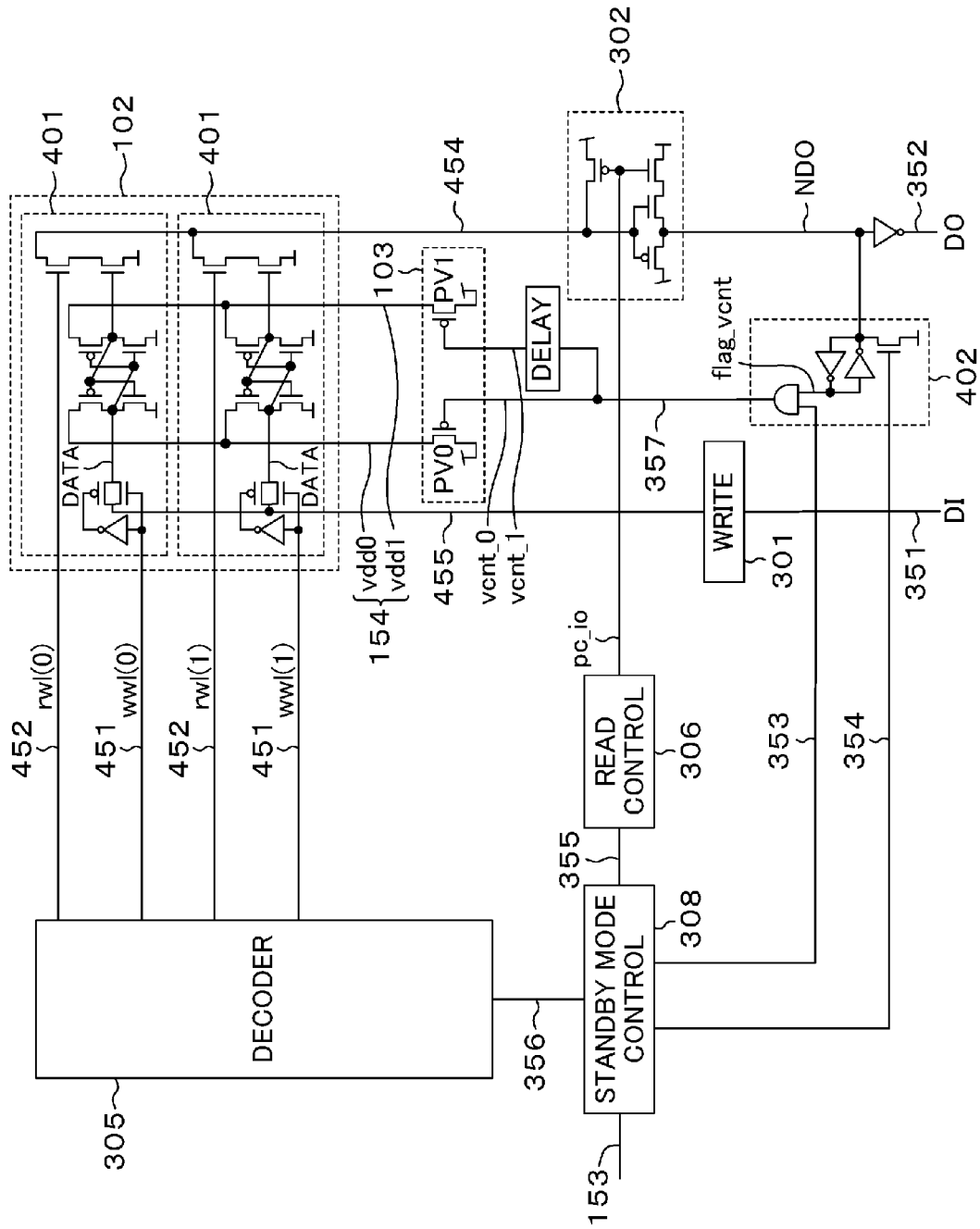
FIG. 4 is a circuit diagram showing a second variation of the semiconductor memory device of FIG. 1.

FIG. 4 shows a specific example circuit. In FIG. 4, the circuit includes memory cells 401 each having separate read and write ports, a match detection circuit/output data holding circuit 402, write word lines wwl(0)-wwl(1) 451, read word lines rwl(0)-rwl(1) 452, a read data line 454, and a write data line 455. The memory cell power supply line 154 includes two power supply lines vdd0 and vdd1. The read circuit 302 has a mechanism of precharging the read data line 454. The read control circuit 306 supplies a precharge control signal pc_io to the read circuit 302.

In the circuit of FIG. 4, when the standby mode control signal 153 is asserted, the data line NDO is reset low and the output data DO is reset high using the reset signal 354. Next, all the read word lines 452 are successively selected to read data from all the memory cells 401. When storage nodes DATA of all the memory cells 401 are high, the read data line 454 is maintained high, so that the data line NDO is maintained low and the output data DO is maintained high. In a read operation, if there is any memory cell 401 whose storage node DATA is low, the read data line 454 is discharged low, so that the data line NDO goes high and the output data DO goes low. When all the memory cells 401 have been read, the flag determination enable signal 353 goes from low to high. When all the memory cells 401 store data which is high, the data line NDO continues to be reset low, and therefore, the flag determination result signal 357 goes high at a time when the flag determination enable signal 353 goes high, so that the transistors PV0 and PV1 of the power supply control circuit 103 are turned off, and therefore, the power supply is cut off.

When the standby mode ends, the standby mode control signal 153 goes low, and the flag determination enable signal 353 goes from high to low. In this case, the power supply control signal vcnt_1 goes from high to low later than the power supply control signal vcnt_0, and therefore, the storage node DATA of the memory cell 401 is reset high.

The memory cell 401 of FIG. 4 has a read circuit in which a transistor whose gate is connected to the storage node and a transistor whose gate is connected to the read word line 452 are connected in series between a ground and the read data line 454. The memory cell 300 of FIG. 2 may have a configuration similar to that of FIG. 4, but the power supply cut-off effect is disadvantageously significantly reduced.

In the above examples of FIGS. 1, 3, and 4, bank division is performed in the same bit, and match determination is performed on memory cells in each bank, to perform a power-saving control, whereby the power supply can be more effectively cut off.

Figure 5:
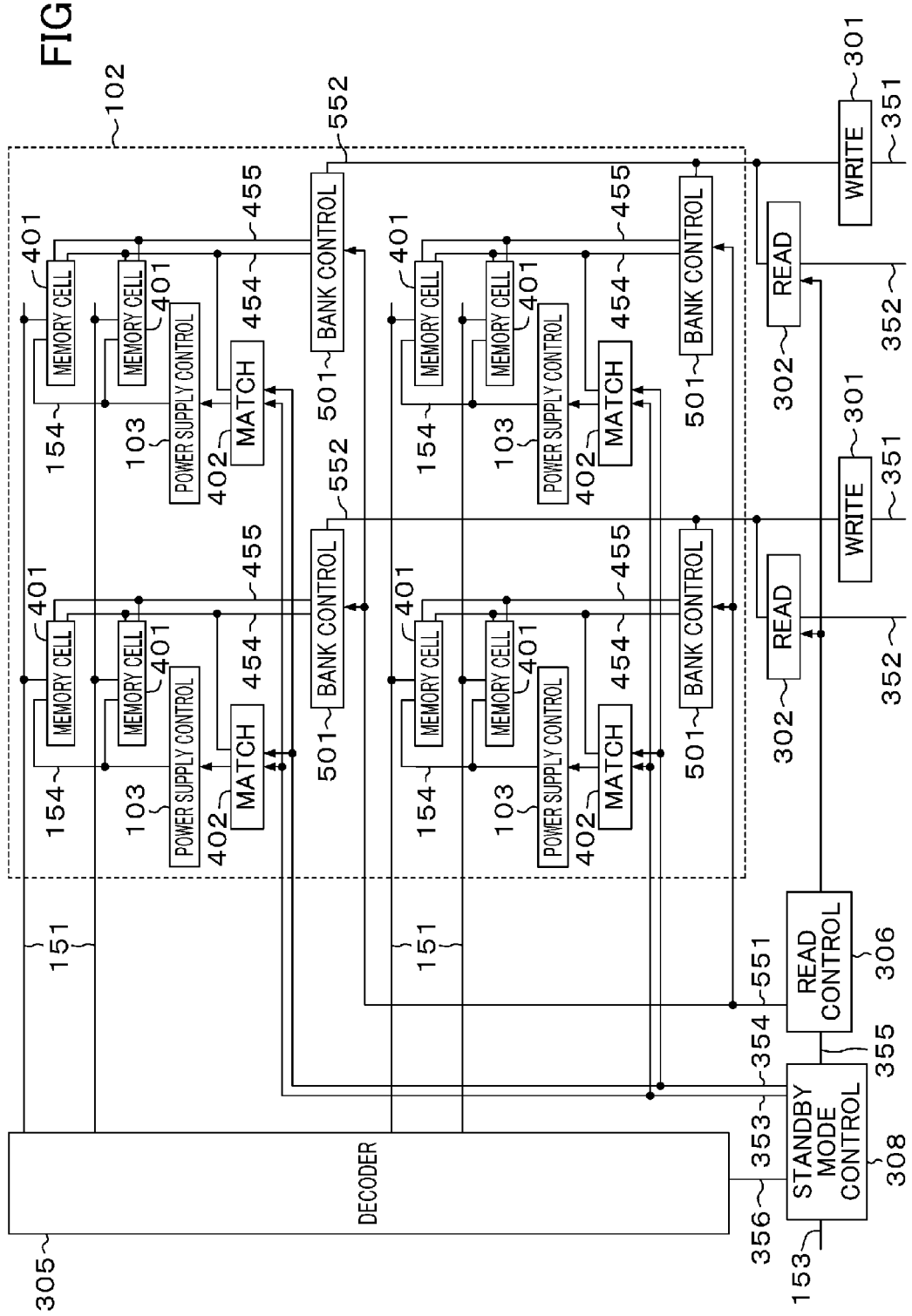
FIG. 5 is a circuit diagram showing a third variation of the semiconductor memory device of FIG. 1.

FIG. 5 shows an example circuit. In FIG. 5, the circuit includes bank read/write control circuits 501, a bank control signal 551, and global input/output data lines 552. In the configuration of FIG. 5, a match detection circuit/output data holding circuit 402 and a power supply control circuit 103 are provided for each bank. While the local read data line 454 in each bank is disconnected from the global input/output data line 552, data match determination can be performed in a plurality of banks simultaneously.

Figure 6:
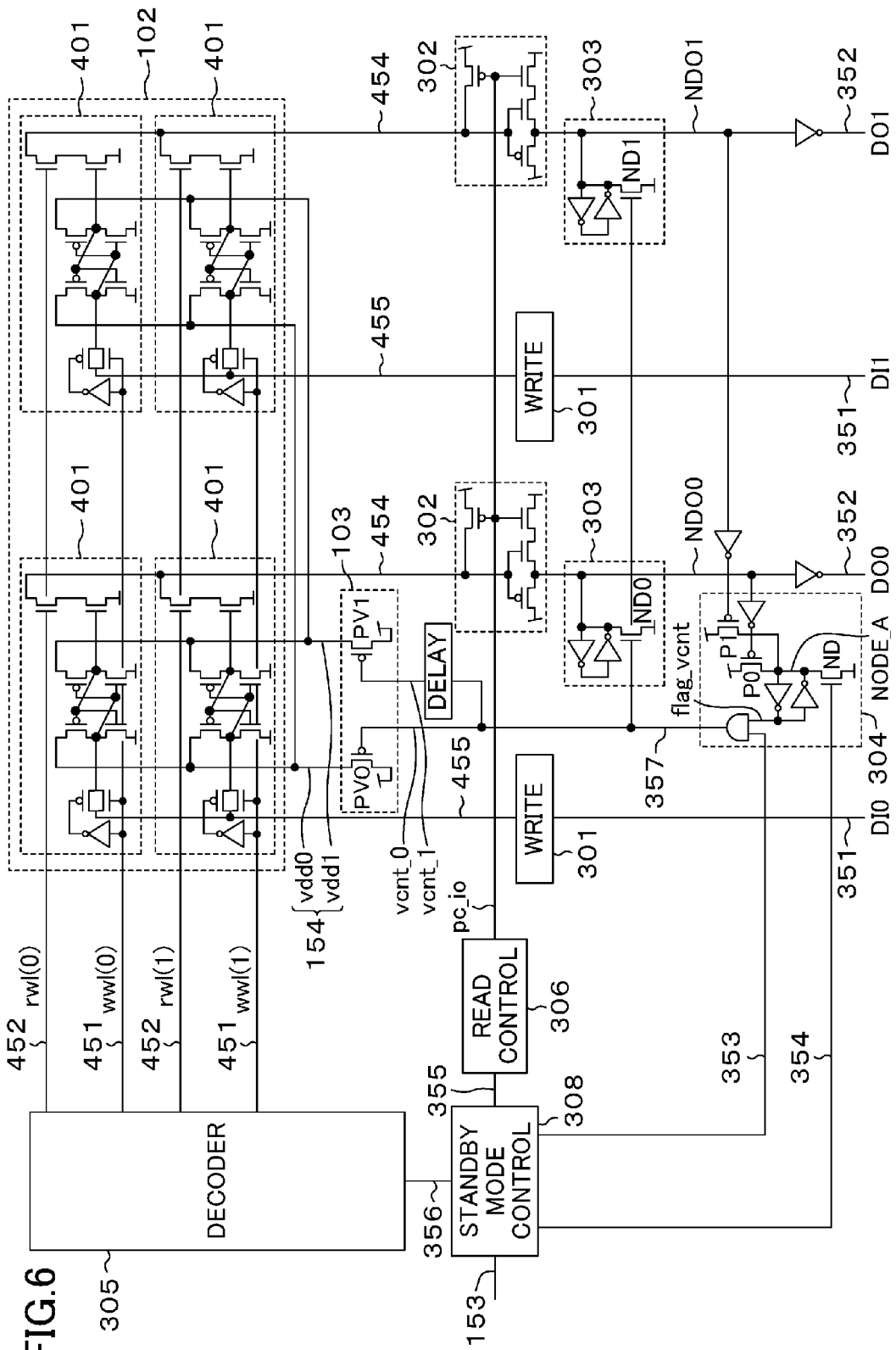
FIG. 6 is a circuit diagram showing a fourth variation of the semiconductor memory device of FIG. 1.

As shown in FIG. 6, the match detection circuit 304 and the power supply control circuit 103 may be shared by a plurality of bits. This configuration advantageously has a smaller area. Note that, in FIG. 6, reference characters ND0 and ND1 indicate transistors in the representative value storage circuit 303, reference characters DI0 and DI1 indicate input data, and reference characters DO0 and DO1 indicate output data.

Similar to the circuit of FIG. 4, in the circuit of FIG. 6, when the standby mode control signal 153 is activated, a node NODE_A of the match detection circuit 304 is reset low by a transistor ND. Next, the read word lines 452 are successively activated to read data from the memory cells 401 in a plurality of bits simultaneously. In this case, when a data line NDO0 or NDO1 goes high in any bit, a transistor P0 or P1 causes the node NODE_A of the match detection circuit 304 to go from low to high. Thereafter, when the flag determination enable signal 353 goes from low to high, the flag signal flag_vcnt is low, and therefore, the flag determination result signal 357 remains low, and the transistors PV0 and PV1 of the power supply control circuit 103 remains on, and therefore, the power supply for the memory cell 401 is not cut off. On the other hand, if data which is high on the data lines NDO0 and NDO1 has never been read out from any bit, then when the flag determination enable signal 353 goes from low to high, the flag signal flag_vcnt remains high, and the flag determination result signal 357 goes from low to high, and therefore, the power supply for the memory cell 401 is cut off. The refilling procedure is similar to that of FIG. 4.

Figure 7:
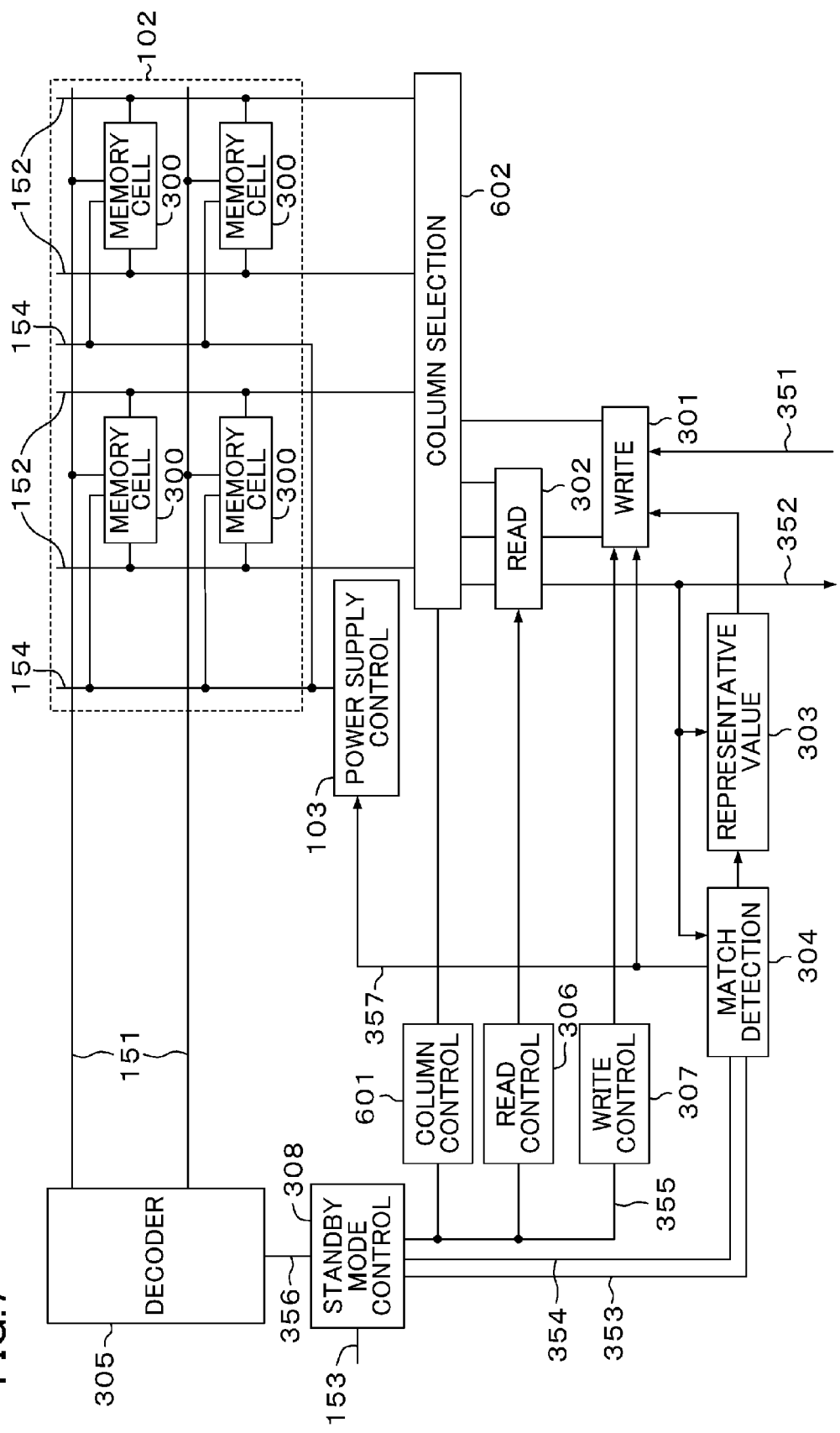
FIG. 7 is a circuit diagram showing a fifth variation of the semiconductor memory device of FIG. 1.

FIG. 7 shows an example in which the match detection circuit 304 and the power supply control circuit 103 are shared in a column of the same bit. In FIG. 7, a reference character 601 indicates a column control circuit, and a reference character 602 indicates a column selection circuit. In this case, the representative value storage circuit 303 can also be shared, resulting in a smaller area. The operating principle is similar to that of FIG. 6.

<<Second Embodiment>>

Figure 8:
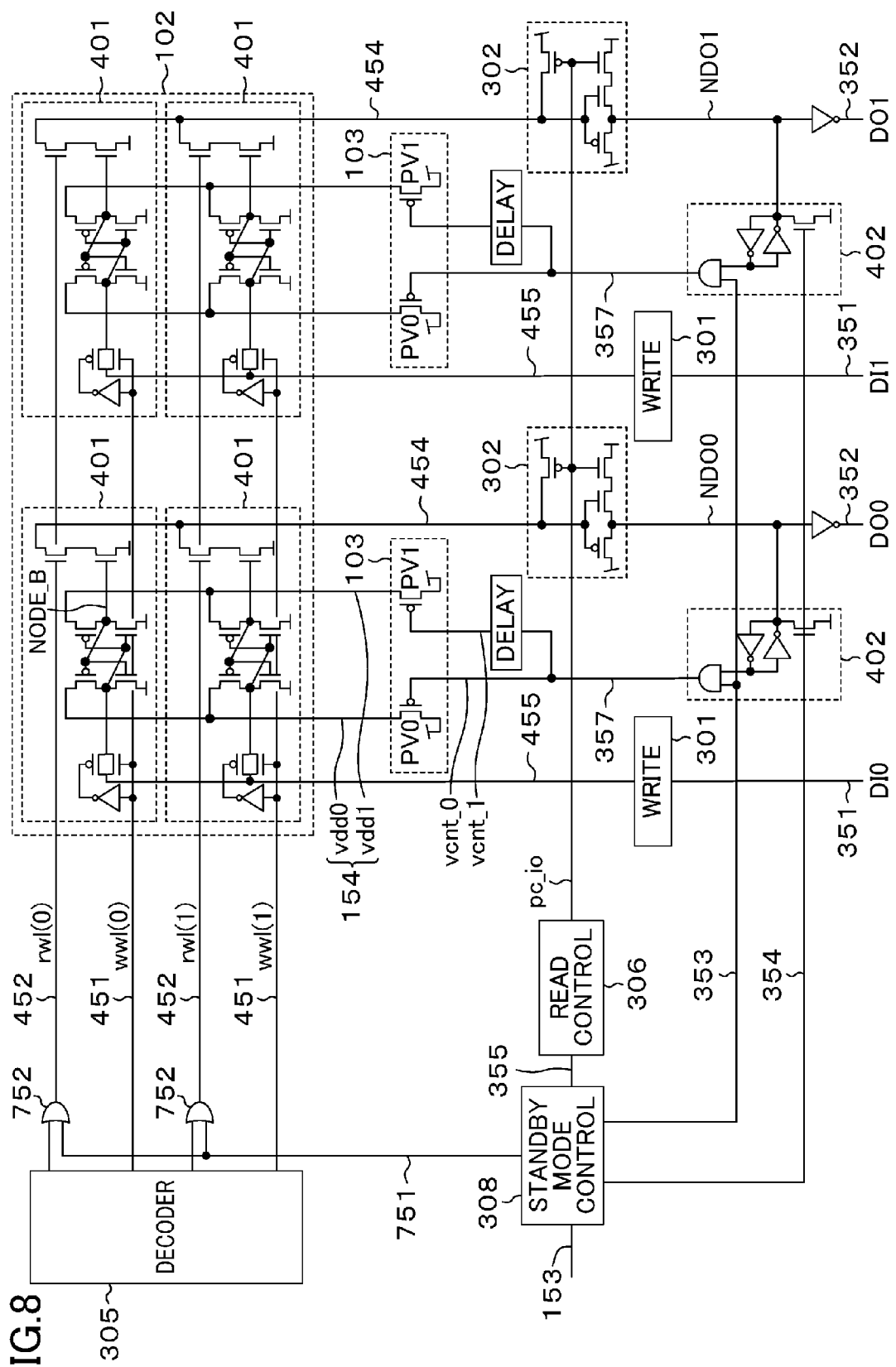
FIG. 8 is a circuit diagram schematically showing a semiconductor memory device according to a second embodiment of the present disclosure.

FIG. 8 is a circuit diagram according to a second embodiment of the present disclosure. The example of FIG. 8 is different from those of FIGS. 4-7 in that a mechanism of multiply selecting the read word lines 452 is provided. As shown in FIG. 8, the read word line 452 is driven by an OR circuit 752 which calculates the logical OR of the normal output of the decoder 305 and a multiple-selection enable signal 751 which is output from the standby mode control circuit 308. As a result, when the standby mode control signal 153 is activated, the multiple-selection enable signal 751 goes from low to high, so that all the read word lines 452 go from low to high. In the memory cell 401 of the type shown in FIG. 8, even if the read word lines 452 are multiply selected, data in the memory cell 401 is not destroyed. When nodes NODE_B of all the memory cells 401 connected to the same read data line 454 are low, the read data line 454 remains precharged at VDD. When the node NODE_B of any of the memory cells 401 is high, the read data line 454 is discharged to VSS. Such a mechanism can be used to determine whether or not data stored in any of the memory cells 401 on the same read data line 454 is high. The operation after the determination is similar to that of the circuit of FIG. 4. Because data stored in the memory cell 401 is not destroyed, the present disclosure is also applicable to read only memory (ROM) etc. The configuration of FIG. 8 can advantageously perform data match determination during one cycle.

Figure 9:
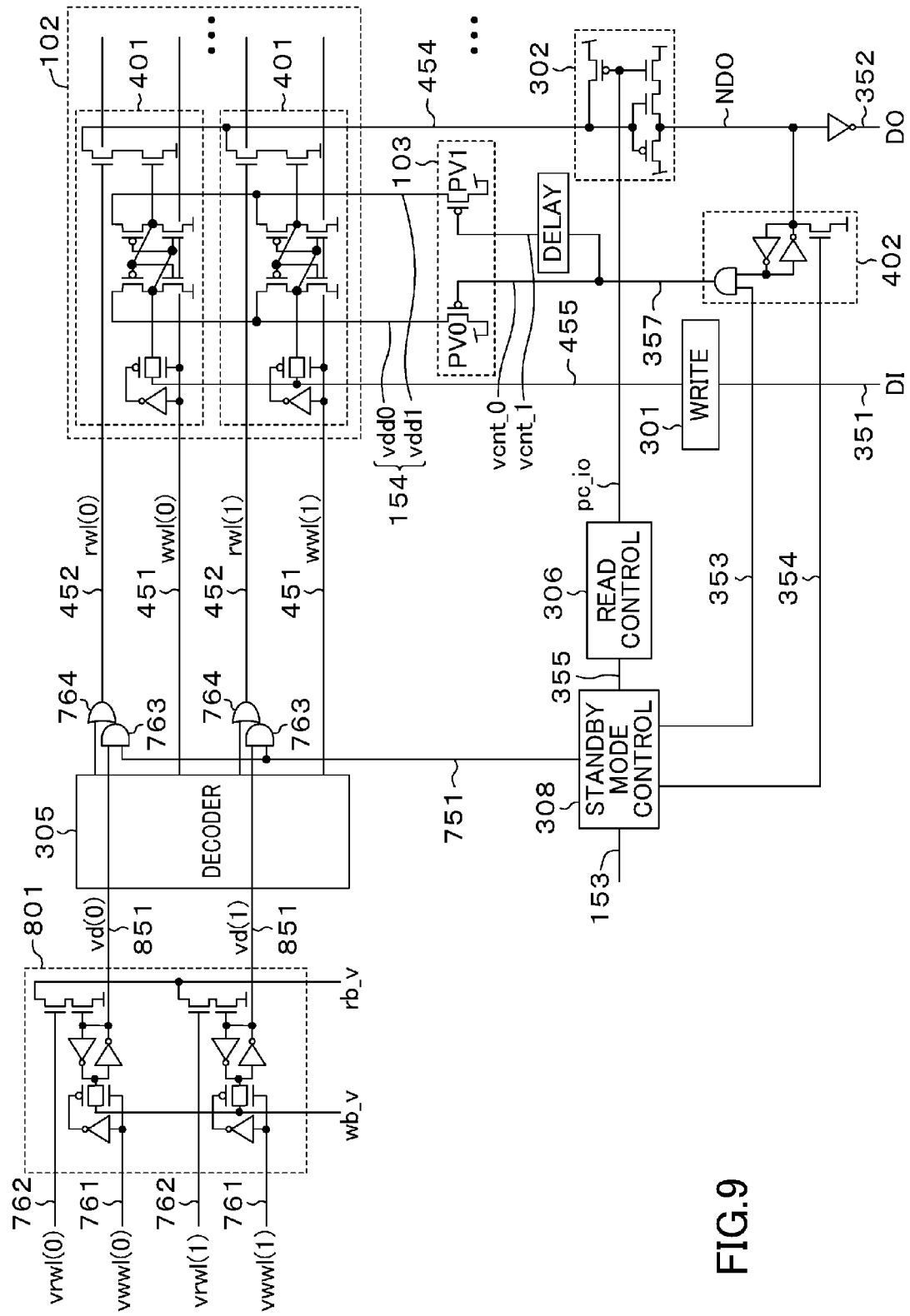
FIG. 9 is a circuit diagram showing an example application of the semiconductor memory device of FIG. 8.

FIG. 9 shows an example application of FIG. 8. In FIG. 8, the read word lines 452 of all the memory cells 401 connected to the same output data line 352 are simultaneously activated. For example, in a cache memory, there may be one or some of those memory cells 401 that has invalid data. Therefore, in the case of FIG. 8, when match determination is performed, a power supply may not be cut off, because the node NODE_B of the memory cell 401 storing invalid information is high, although the power supply could otherwise be cut off. To address such a case, in FIG. 9, the multiple-selection enable signal 751 is masked based on information stored in a valid memory cell array 801 which indicates whether or not a word in the memory cell array 102 is invalid.

Specifically, in the valid memory cell array 801 of FIG. 9, a reference character 761 indicates write word lines vwwl(0)- vwwl(1), a reference character 762 indicates read word lines vrwl(0)-vrwl(1) a reference character 851 indicates valid flag lines vd(0)-vd(1), a reference character wb_v indicates a write data line, and a reference character rb_v indicates a read data line. AND circuits 763 are provided each of which calculates the logical AND of a signal on the valid flag line 851 and the multiple-selection enable signal 751. The read word lines 452 of the memory cell array 102 are multiply selected by OR circuits 764 each of which calculates the logical OR of the output of the corresponding AND circuit 763 and the output of the decoder 305.

<<Third Embodiment>>

Figure 10:
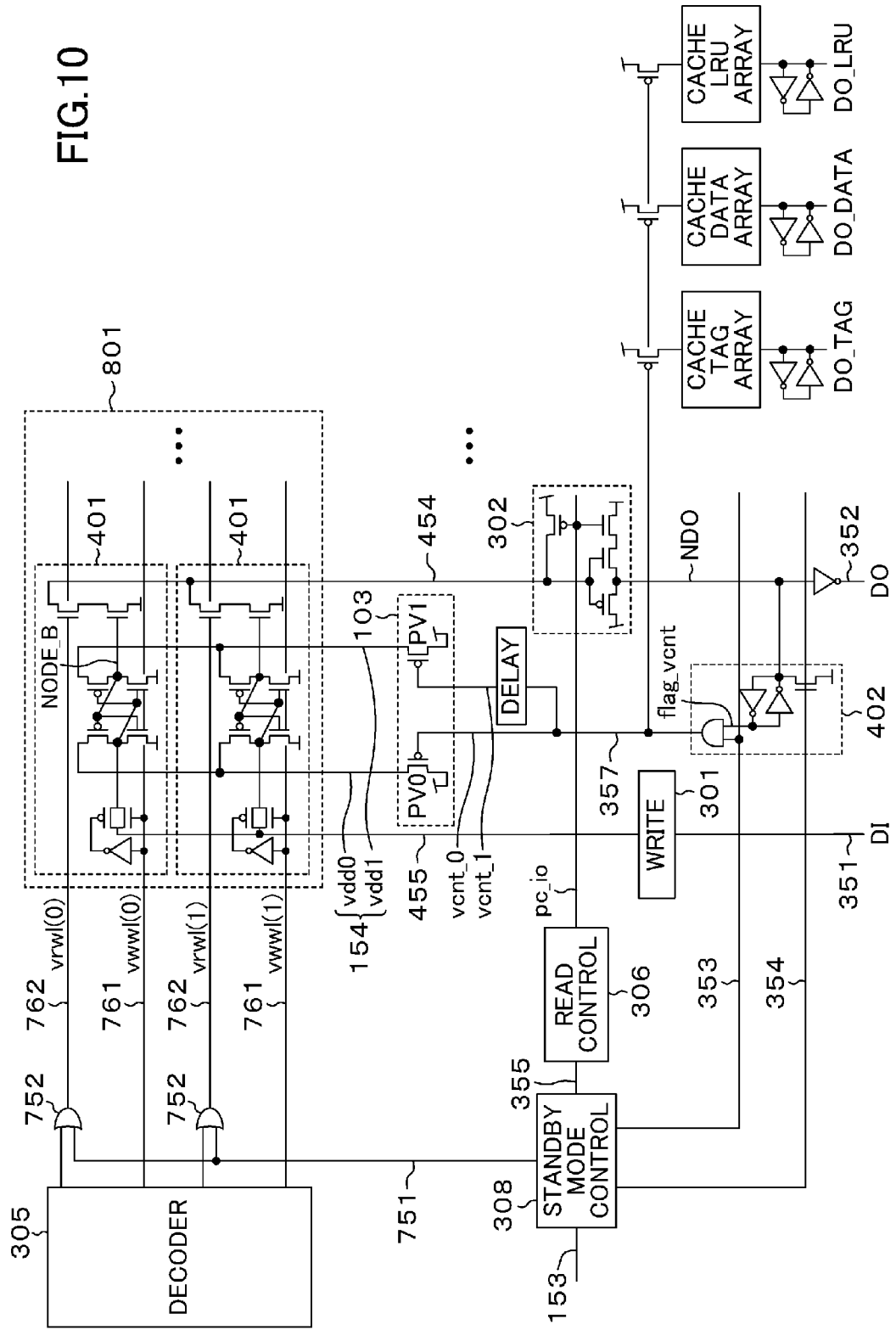
FIG. 10 is a circuit diagram schematically showing a semiconductor memory device according to a third embodiment of the present disclosure.

FIG. 10 is a circuit diagram of a third embodiment of the present disclosure. In FIG. 10, the match detection circuit/output data holding circuit 402 is connected to the data line NDO of the valid memory cell array 801 which stores a valid bit of a cache memory. When the standby mode control signal 153 is activated, data match determination is performed. In this case, if it is determined that all data values in a column of memory cells 401 which store a valid bit are low, it is indicated that stored information of a tag macro and a data macro of the corresponding way is not required. Therefore, the flag determination result signal 357 of the match detection circuit/output data holding circuit 402 in which a valid bit is provided is used not only to switch on and off the transistors PV0 and PV1 of the power supply control circuit 103 for the valid memory cell array 801, but also to control a power supply for a tag macro having a data line DO_TAG, a power supply for a data macro having a data line DO_DATA, and a power supply for an LRU array having a data line DO_LRU, whereby the useless leakage current can be reduced.

The match detection circuit/output data holding circuit 402 of FIG. 10 determines whether or not all data values in the memory cells 401 are low. Therefore, a complicated control unit is not required, and therefore, the system can be simplified. Note that, even in this case, not only power supplies for a tag macro and a data macro, but also a power supply for a data line of a corresponding valid bit and a power supply for a peripheral circuit, can be cut off.

<<Fourth Embodiment>>

Figure 11:
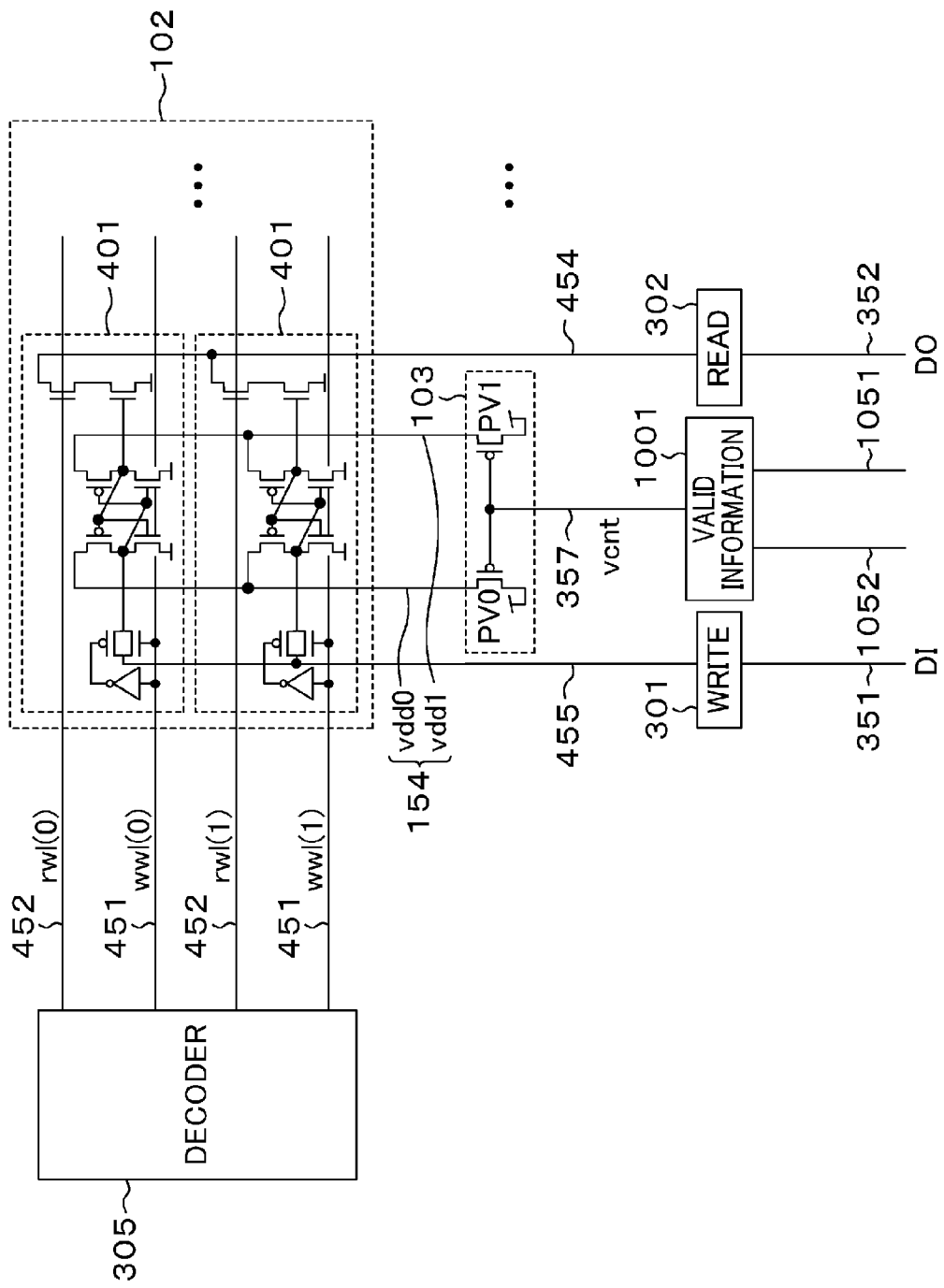
FIG. 11 is a circuit diagram schematically showing a semiconductor memory device according to a fourth embodiment of the present disclosure.

FIG. 11 is a circuit diagram of a fourth embodiment of the present disclosure. The fourth embodiment is different from the first to third embodiments in that the power supply control circuit 103 is controlled by a valid information storage circuit 1001 provided for each bit. The valid information storage circuit 1001 stores information indicating whether or not the bit is valid. The valid information storage circuit 1001 receives a system reset signal 1052 and a valid flag input signal 1051, and outputs the flag determination result signal 357 to the power supply control circuit 103. As a result, a power supply for a bit which is not used in system operation can be cut off when necessary, whereby the useless leakage current can be reduced.

Figure 12:
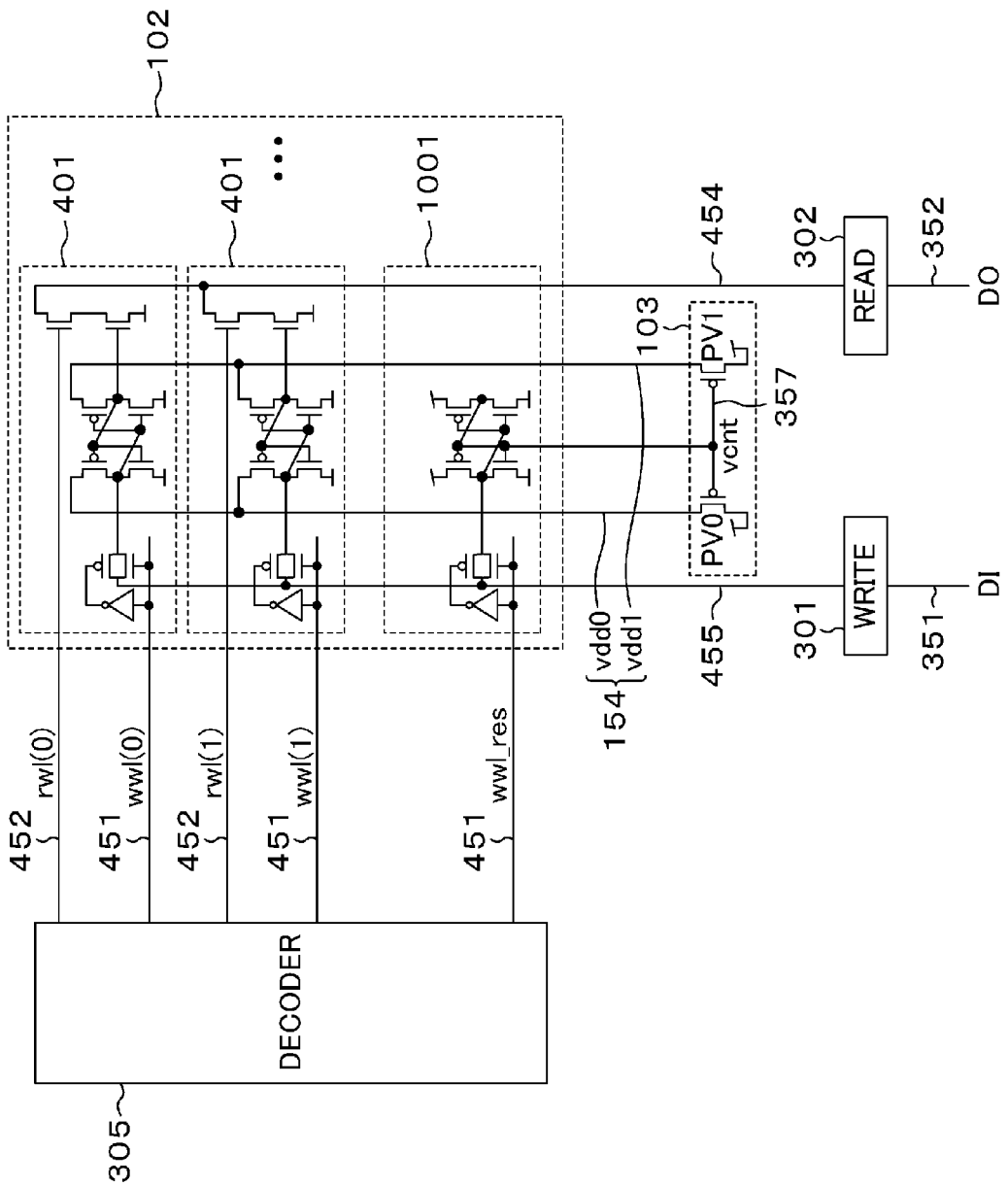
FIG. 12 is a circuit diagram showing a variation of the semiconductor memory device of FIG. 11.

As shown in FIG. 12, if the valid information storage circuit 1001 for each bit is assigned to one word of the memory cell array 102, the area can be reduced. In this case, the data storage memory cell 401 and the valid information storage circuit 1001 can share the write data line 455. When write operation is performed, a write word line wwl_res of a memory cell included in the valid information storage circuit 1001 is activated, and at the same time, valid information of the bit is set. Alternatively, a latch for holding output data provided in an output portion may be used as the valid information storage circuit 1001. In this case, similar advantages are obtained.

<<Fifth Embodiment>>

Figure 13:
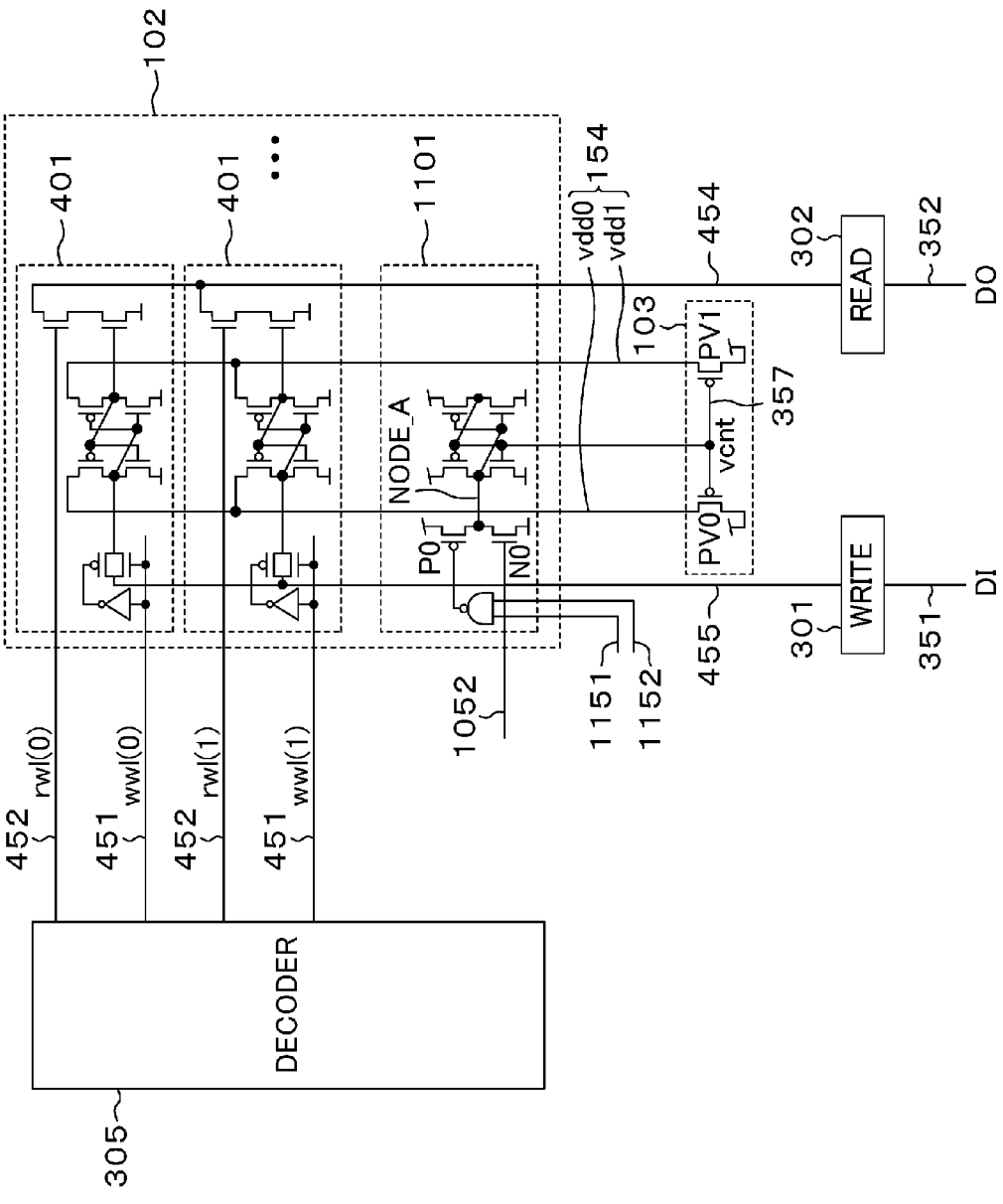
FIG. 13 is a circuit diagram schematically showing a semiconductor memory device according to a fifth embodiment of the present disclosure.

FIG. 13 is a circuit diagram of a fifth embodiment of the present disclosure. In FIG. 13, a power supply for a bit column is controlled based on information of a write detection circuit 1101 provided for each bit. If write operation has never been performed on the memory cells 401 in a bit column since the system was started up, data values stored in the memory cells 401 in the bit column are invalid. Therefore, by cutting off the power supply for the bit column, the useless leakage current can be reduced.

In the configuration of FIG. 13, when the system is started up, the system reset signal 1052 goes from low to high, and the node NODE_A of the write detection circuit 1101 is reset low by the transistor N0. As a result, the power supply control signal vcnt goes high, so that the power supply lines vdd0 and vdd1 of the memory cell 401 transition to the floating state. During this period, substantially no leakage current flows in the memory cells 401 in the bit column. Thereafter, when a column write enable signal 1151 and a byte write enable signal 1152 are simultaneously activated, the transistor P0 causes the node NODE_A of the write detection circuit 1101 to go high. As a result, the power supply control signal vcnt goes low, and the power supply lines vdd0 and vdd1 are driven to VDD.

Figure 14:
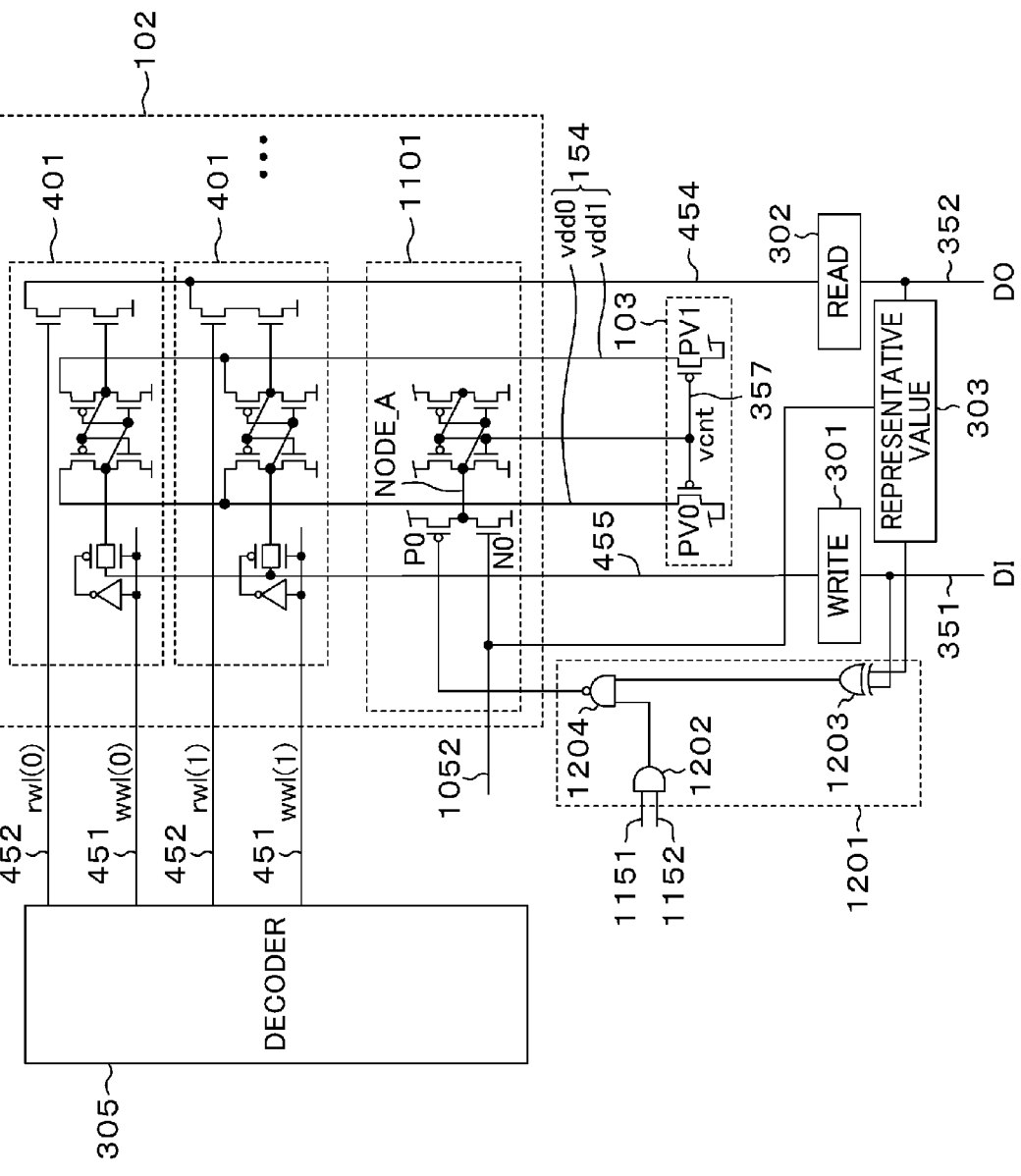
FIG. 14 is a circuit diagram showing an example application of the semiconductor memory device of FIG. 13.

FIG. 14 shows an example application of FIG. 13. In FIG. 14, a write data determination circuit 1201 includes an AND circuit 1202, an EOR circuit 1203, and an NAND circuit 1204. Even when data write operation is performed to the memory cell 401, then if the same data as that which is stored in the representative value storage circuit 303 provided at the read circuit 302 is written, and there is a read access corresponding to the bit, the data may be read from the representative value storage circuit 303. Therefore, a power supply for the memory cell 401 does not need to be turned on. When data different from data stored in the representative value storage circuit 303 is written, the memory cells 401 in the column are reset, and the different data is written to the desired memory cell 401, whereby normal operation for the system can be performed. With such a configuration, the useless leakage current can be further reduced.

In FIG. 14, similar to FIG. 13, when the system is started up, the system reset signal 1052 goes from low to high, and the node NODE_A of the write detection circuit 1101 is reset low by the transistor N0. As a result, the power supply control signal vcnt is reset high, and the power supply lines vdd0 and vdd1 to the memory cell 401 transition to the floating state. However, if data stored in the representative value storage circuit 303 is different from the write data DI on the input data line 351, then when the output of the EOR circuit 1203 goes high, and at the same time, the column write enable signal 1151 and the byte write enable signal 1152 are activated, the transistor P0 causes the node NODE_A of the write detection circuit 1101 to go high. As a result, the power supply control signal vcnt goes low, and the power supply lines vdd0 and vdd1 are driven to VDD.

<<Sixth Embodiment>>

When zero is stored in a valid bit of a cache memory, data in a row corresponding to a tag macro and a data macro is invalid. Therefore, separate power supplies for a tag macro and a data macro may be provided for each row, and a power supply for the memory cells 401 in a row may be controlled based on stored data of the valid bit, whereby the useless leakage current can be reduced.

Figure 15:
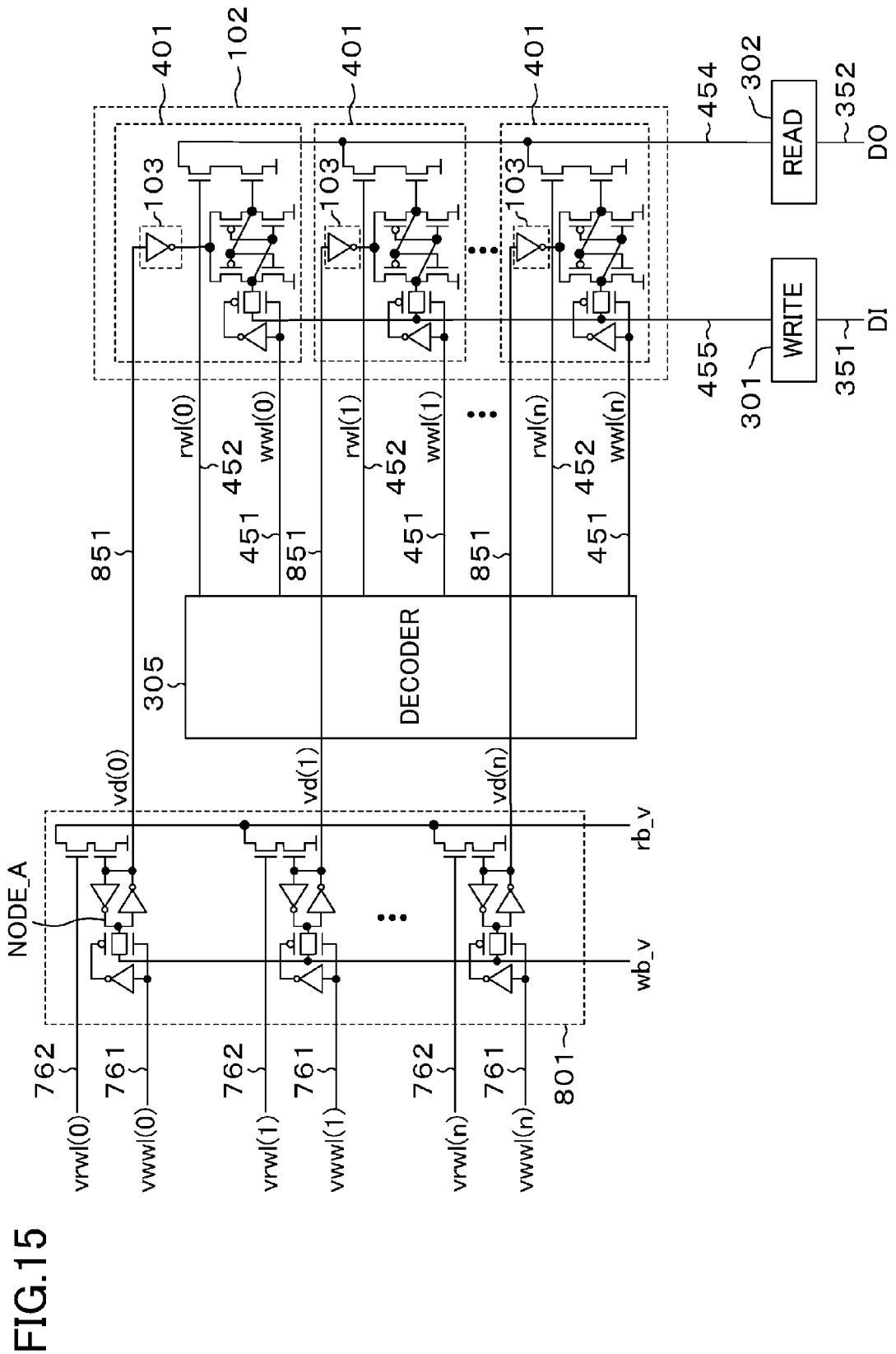
FIG. 15 is a circuit diagram schematically showing a semiconductor memory device according to a sixth embodiment of the present disclosure.

FIG. 15 shows an example circuit for achieving this. In FIG. 15, a separate power supply for the memory cell array 102 is provided for each row, and the power supply control circuit 103 is provided for each row. The valid flag line 851 is connected to the power supply control circuit 103. When the memory cell node NODE_A of the valid memory cell array 801 is set to be low, a valid control signal vd of the corresponding row goes high, and a VDD power supply for the memory cells 401 in the corresponding row of the memory cell array 102 goes low. In this case, substantially no leakage current flows in the memory cell 401. Conversely, when the memory cell node NODE_A of the valid memory cell array 801 is set to be high, VDD is supplied to the power supply of the memory cells 401 in the memory cell array 102.

Figure 16:
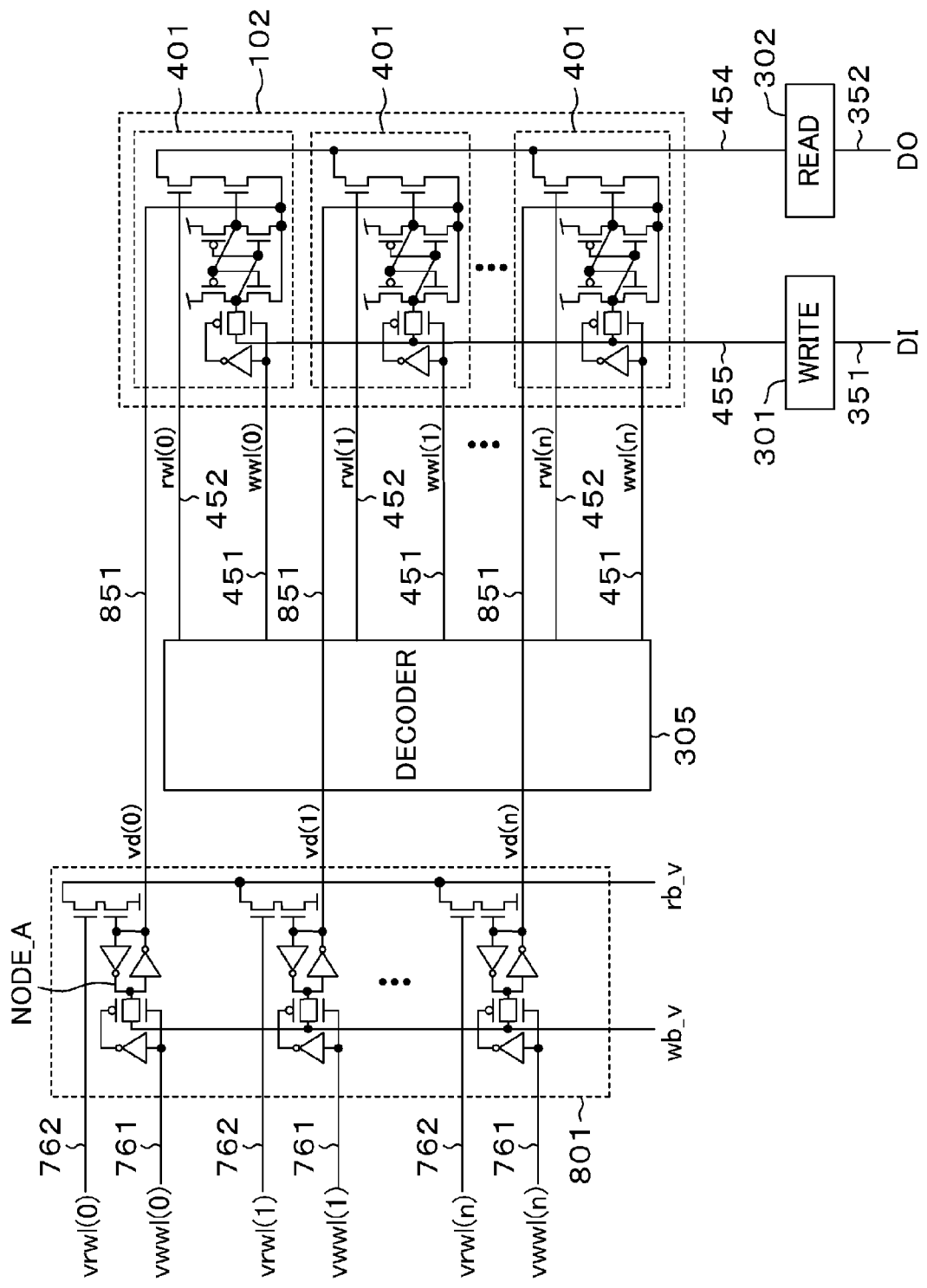
FIG. 16 is a circuit diagram showing a variation of the semiconductor memory device of FIG. 15.

FIG. 16 shows a circuit configuration which has connections different from those of FIG. 15 and provides advantages similar to those of FIG. 15. While the VDD power supply for the memory cell 401 is controlled in FIG. 15, the VSS power supply is controlled in FIG. 16. In the circuit of FIG. 16, the source of a transistor which extracts charge from the read data line 454 is also cut off, the leakage current is reduced further than in FIG. 15.

With this similar configuration, even in a tag macro, a data macro, an LRU array, etc. of a row corresponding to a low valid bit, a leakage current flowing in the memory cell 401 existing in the row can be significantly reduced.

In FIGS. 15 and 16, an example has been described in which only a power supply for the memory cells 401 provided in a row is controlled by the power supply control circuit 103. Alternatively, if a power supply for a peripheral circuit (e.g., a word driver etc.) of a corresponding row is also controlled by the power supply control circuit 103, the leakage current can be further reduced.

The valid bit has been described as an example. The present disclosure is not limited to the valid bit. Alternatively, a special information storage memory cell may be provided for each word to store information indicating the word in which a defect has been detected by BIST, and a power supply for a memory cell which stores useless information present in a word containing a defect may be cut off, whereby the useless leakage current can be reduced.

In addition, for example, a power supply for memory cells contained in a word may be controlled using a memory cell which stores combination information including valid bit information and defect detection information.

Note that if a memory cell is provided for each of a tag macro and a data macro, the number of interconnects external to a memory can be reduced.

<<Seventh Embodiment>>

Figure 17:
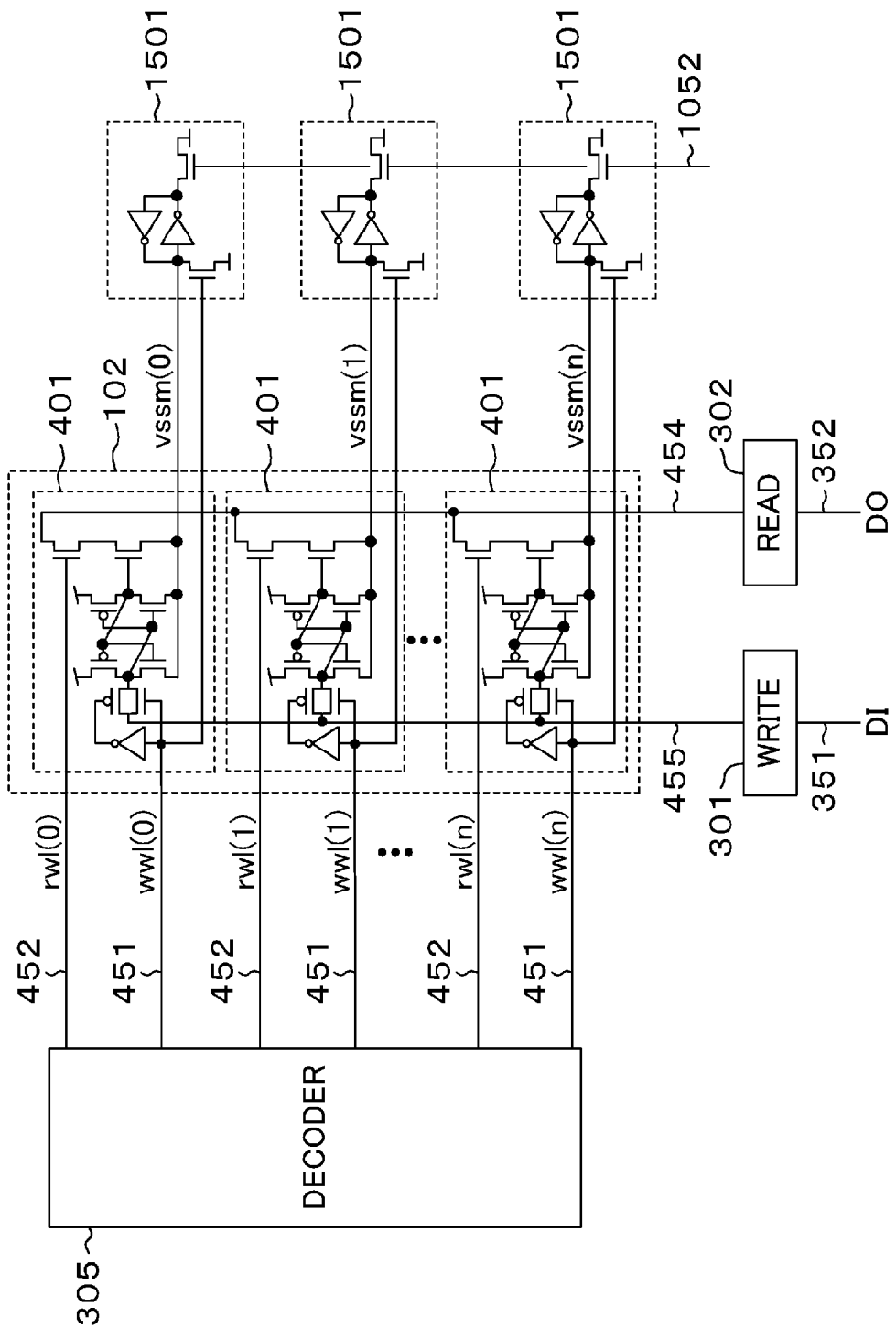
FIG. 17 is a circuit diagram schematically showing a semiconductor memory device according to a seventh embodiment of the present disclosure.

FIG. 17 is a circuit diagram of a seventh embodiment of the present disclosure.

Similar to FIG. 13, information about a memory cell 401 in which write operation has not been performed is not required, and therefore, the power supply can be cut off. In FIG. 17, a separate power supply is provided for each row in the memory cell array 102, and a write detection circuit 1501 is provided for each row. A power supply for the memory cells 401 in a row is controlled by the write detection circuit 1501 which receives a signal on the write word line 451 and the system reset signal 1052.

When the system is started up, a pulse is input to the system reset signal 1052 to reset all the write detection circuits 1501 so that VSS power supply lines vssm(0)-vssm(n) are set to VDD. In this case, substantially no leakage current flows in the memory cell 401. Thereafter, when write operation is performed on a word, the write detection circuit 1501 is rewritten so that the corresponding write word line 451 goes from low to high and the corresponding VSS power supply line vssm goes low. As a result, the VSS power supply for the corresponding memory cell 401 is driven to VSS.

The use of the write word line 451 removes the necessity of an additional signal indicating write operation to a word, leading to advantages in terms of area and speed.

Similar to the sixth embodiment, if a power supply for a peripheral circuit, such as a word driver provided for each row etc., is also controlled, the leakage current can be further reduced.

If the write detection circuit 1501 is provided in the word driver and is combined with the circuit of the write word driver, the area can be reduced.

<<Eighth Embodiment>>

Figure 18:
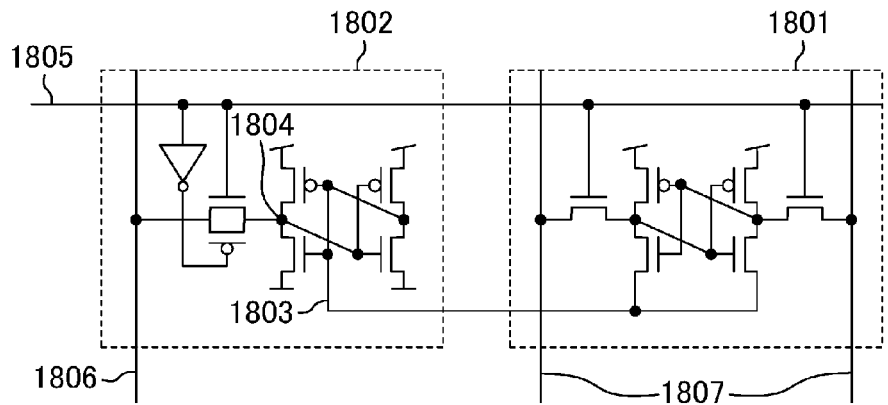
FIG. 18 is a circuit diagram schematically showing a semiconductor memory device according to an eighth embodiment of the present disclosure.

FIG. 18 is a circuit diagram of an eighth embodiment of the present disclosure. The configuration of FIG. 18 will be roughly described. The configuration of FIG. 18 includes a first storage circuit 1801 and a second storage circuit 1802. The sources of NMOS transistors in the first storage circuit 1801 are connected to one (first storage node 1803) of a first and a second storage node 1803 and 1804 of the second storage circuit 1802. A reference character 1805 indicates a common word line of the first and second storage circuits 1801 and 1802, a reference character 1806 indicates a write data line of the second storage circuit 1802, and a reference character 1807 indicates a pair of bit lines of the first storage circuit 1801. When the first storage node 1803 of the second storage circuit 1802 is set to be low, the first and second storage circuits 1801 and 1802 operate as SRAM. When the first storage node 1803 of the second storage circuit 1802 is set to be high, a leakage path is eliminated from the first storage circuit 1801, whereby standby power can be reduced.

Figure 19:
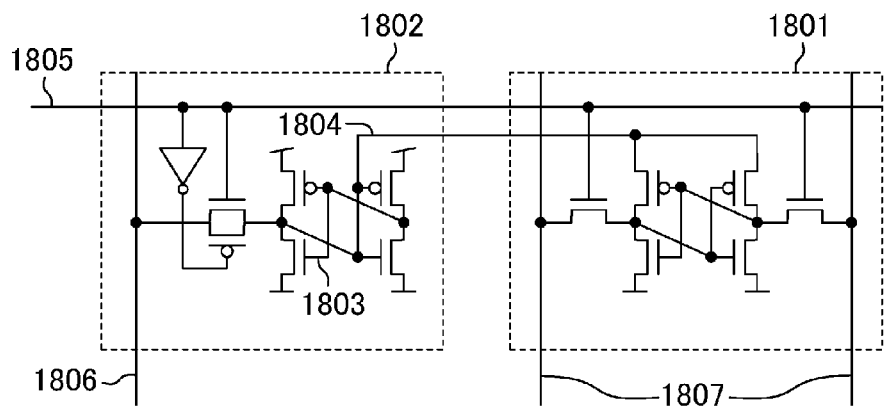
FIG. 19 is a circuit diagram showing a first variation of the semiconductor memory device of FIG. 18.

FIG. 19 is a circuit diagram of a first variation. FIG. 19 is different from FIG. 18 in that the second storage node 1804 of the second storage circuit 1802 is connected to the sources of PMOS transistors included in the first storage circuit 1801. When the second storage node 1804 of the second storage circuit 1802 is set to be high, the first and second storage circuits 1801 and 1802 operate as SRAM. When the second storage node 1804 of the second storage circuit 1802 is set to be low, a leakage path is eliminated from the first storage circuit 1801, whereby standby power can be reduced. In general, a VDD power supply for a memory cell in SRAM is shared by adjacent memory cells. In this case, the configuration of FIG. 19 is more versatile than that of FIG. 18 in terms of the control of a power supply for any memory cell.

Figure 20:
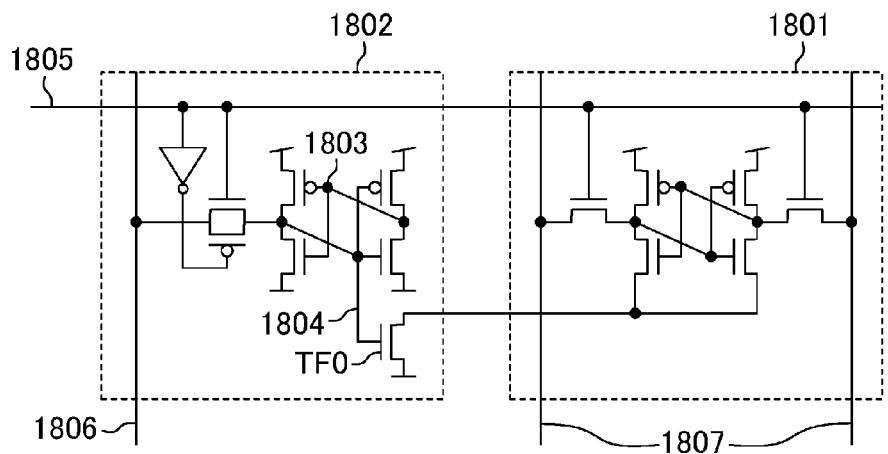
FIG. 20 is a circuit diagram showing a second variation of the semiconductor memory device of FIG. 18.

FIG. 20 is a circuit diagram of a second variation. A power supply control transistor TF0 is provided between the sources of NMOS transistors of the first storage circuit 1801 and a VSS power supply. The second storage node 1804 of the second storage circuit 1802 is connected to the gate of the power supply control transistor TF0. With the configuration of FIG. 20, advantages similar to those of FIG. 18 can be achieved. In addition, the data holding characteristics of the first and second storage circuits 1801 and 1802 are improved further than in FIG. 18.

The configurations of FIGS. 18, 19, and 20 are effective in a translation look-aside buffer (TLB). If the first storage circuit 1801 serves as a physical address cell which stores a physical address, and the second storage circuit 1802 serves as a page size cell which stores a page size, a leakage current in the standby state of a physical address cell which stores invalid data can be reduced. Moreover, charging and discharging of a useless bit line during physical address read operation can be reduced or prevented, whereby power consumption can be reduced.

Figure 21:
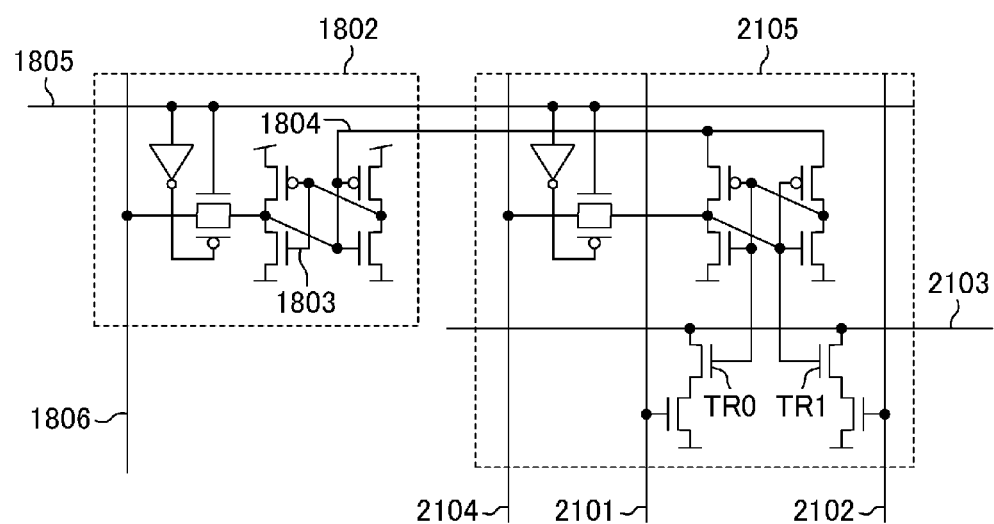
FIG. 21 is a circuit diagram showing a third variation of the semiconductor memory device of FIG. 18.

FIG. 21 is a circuit diagram of a third variation. The configuration of FIG. 21 will be roughly described. In FIG. 21, the sources of PMOS transistors included in a first storage circuit 2105 having a comparison function are connected to the second storage node 1804 of the second storage circuit 1802. The first storage circuit 2105 having a comparison function includes a first comparison data line 2101, a second comparison data line 2102, a match line 2103, and a write data line 2104. When the second storage node 1804 of the second storage circuit 1802 is high, the first storage circuit 2105 having a comparison function compares data on the first comparison data line 2101 and data on the second comparison data line 2102 which has the inverse logic of the data on first comparison data line 2101, with data stored in the first storage circuit 2105 having a comparison function. Based on the comparison result, comparison result determination transistors TR0 and TR1 are switched on and off so that compare/read operation is performed. When the second storage node 1804 of the second storage circuit 1802 is low, the gates of the comparison result determination transistors TR0 and TR1 never go high, and therefore, the comparison result determination transistors TR0 and TR1 are invariably off, so that the comparison result of the first storage circuit 2105 having a comparison function is masked. Thus, in the first storage circuit 2105 having a comparison function, when the comparison result needs to be masked, the source potential of the PMOS transistor is low, and therefore, the leakage current can be reduced during the standby mode. In a typical SRAM cell, the NMOS transistor and a memory cell adjacent thereto share a VSS power supply, and therefore, when a power supply control is performed on the first storage circuit 2105 having a comparison function, a power supply for the PMOS transistor may be controlled as shown in FIG. 21.

Figure 22:
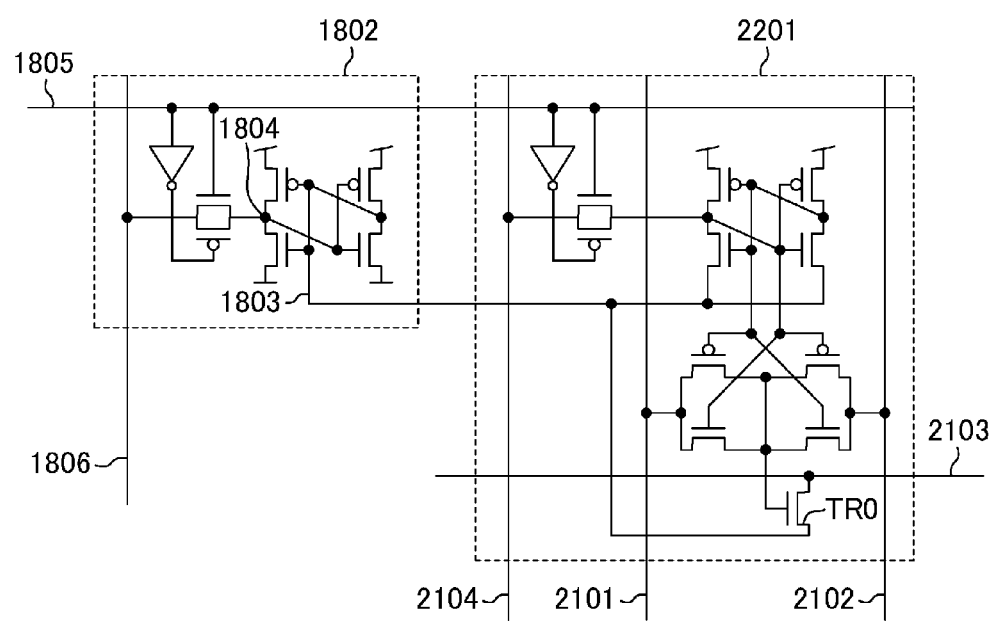
FIG. 22 is a circuit diagram showing a fourth variation of the semiconductor memory device of FIG. 18.

FIG. 22 is a circuit diagram of a fourth variation. The configuration of FIG. 22 will be roughly described. A first storage circuit 2201 having a comparison function of FIG. 22 and the first storage circuit 2105 having a comparison function of FIG. 21 have different configurations but have the same function. The sources of NMOS transistors included in the first storage circuit 2201 having a comparison function of FIG. 22 and the source of a comparison result determination transistor TR0 are connected to the first storage node 1803 of the second storage circuit 1802. When the first storage node 1803 of the second storage circuit 1802 is low, the first storage circuit 2201 having a comparison function performs operation similar to the compare/read operation of the first storage circuit 2105 having a comparison function of FIG. 21. When the first storage node 1803 of the second storage circuit 1802 is high, the leakage current can be reduced as in FIG. 21. Also, because the source potential of the comparison result determination transistor TR0 is high, the comparison result determination transistor TR0 does not drive the match line 2103 to low, and therefore, the function of masking the comparison result can be achieved.

The configurations of FIGS. 21 and 22 are also effective in TLB. If the first storage circuits 2105 and 2201 having a comparison function are each a content addressable memory (CAM) which stores a physical address, and the second storage circuit 1802 is a page size cell which stores a page size, the useless leakage current can be reduced in TLB.

The useless leakage current can be similarly reduced in ternary CAM (TCAM) in the communications field in addition to TLB.

Note that, in the above embodiments, a power supply for a memory cell which does not need to hold data is cut off. Instead of cutting off the power supply, the leakage current may be similarly reduced by decreasing the voltage of the VDD power supply to a level lower than a normal level, or increasing the voltage of the VSS power supply to a level higher than a normal level. Although the leakage current reduction effect in this case is lower than that which is obtained when the power supply is cut off, returning to the active state from the power consumption standby mode is advantageously more quickly performed.

Moreover, if the VDD power supply is decreased or the VSS power supply is increased within the range in which data in a memory cell is held, the memory cell data is held in the low-power consumption standby mode as well. As a result, as in the configuration of the first embodiment, even when a power supply for a memory cell storing duplicate data is in the low power consumption standby mode, a process of rewriting data of the memory cell with the duplicate data during returning to the active state is advantageously no longer required.

If the first to eighth embodiments are combined, the resulting configuration may have the advantages thereof in combination. The standby mode control signal 153 has been described as a signal which is used to enable the power supply control circuit 103. Alternatively, any signal that has a different role in another system, but has the same effect, should be encompassed by the present disclosure.

As described above, the semiconductor memory device of the present disclosure can significantly reduce the standby power and reduce the leakage current during operation, and therefore, is useful as SRAM etc.

What is claimed is:

1. A semiconductor memory device comprising:
    a memory cell array including a plurality of memory cells connected together in a matrix;
    a power supply control circuit configured to cut off or perform a low-power consumption standby control on separate power supply lines, each power supply line being provided for each column of the memory cells, independently on a column-by-column basis;
    a match detection circuit configured to detect whether or not data values of the memory cells in each column of the memory cell array are equal to each other, in response to a predetermined control signal; and
    a representative value storage circuit configured to store match data detected by the match detection circuit,
    wherein the power supply control circuit is controlled by the match detection circuit.

2. The semiconductor memory device of claim 1, wherein:
    the memory cell array is divided into a plurality of blocks, and
    the power supply control circuit and the representative value storage circuit are provided for each of the blocks.

3. The semiconductor memory device of claim 1, wherein at least one of the power supply control circuit and the representative value storage circuit is shared by a plurality of columns of the memory cell array.

4. The semiconductor memory device of claim 1, wherein the power supply control circuit controls a power supply for the memory cells provided in each column of the memory cell array, and a power supply for a peripheral circuit for each column of the memory cell array.

5. The semiconductor memory device of claim 1, further comprising:
    a circuit configured to simultaneously select a plurality of read word lines of the memory cell array in response to the predetermined control signal.

6. The semiconductor memory device of claim 5, wherein the plurality of read word lines are masked by a special information storage memory cell.

7. The semiconductor memory device of claim 1, wherein:
    the match detection circuit is provided in a column of the memory cells storing special information about a cache way, and power supplies for a tag macro and a data macro of a corresponding way are controlled based on an output of the match detection circuit.

8. The semiconductor memory device of claim 7, wherein the column of memory cells storing the special information is a column of the memory cells storing a valid bit of a cache memory.

9. A semiconductor memory device comprising:
a memory cell array including a plurality of memory cells connected together in a matrix; and
a power supply control circuit configured to cut off or perform a low-power consumption standby control on separate power supply lines, each power supply line being provided for each column of the memory cells, independently on a column-by-column basis, wherein:
the power supply control circuit is controlled by a valid information storage circuit configured to store information indicating that data of the memory cells in a column of the memory cell array is valid or not, and
when the information stored in the valid information storage circuit indicates that the data of the memory cells in a column of the memory cell array is not valid, the power supply control circuit cuts off or performs the low-power consumption standby control on a separate power supply line for the column.

10. A semiconductor memory device comprising:
a memory cell array including a plurality of memory cells connected together in a matrix;
a power supply control circuit configured to cut off or perform a low-power consumption standby control on separate power supply lines, each power supply line being provided for each column of the memory cells, independently on a column-by-column basis; and
a write detection circuit configured to detect that write operation has been performed on a column of the memory cell array, wherein:
the power supply control circuit is controlled by whether the write detection circuit detects the write operation has been performed on the column or not,
when the write detection circuit does not detect the write operation has been performed on a column, the power supply control circuit cuts off or performs the low-power consumption standby control on a separate power supply line for the column,
the semiconductor memory device further comprises
a write data determination circuit configured to determine whether or not write data is the same as data stored in a representative value storage circuit, and the power supply control circuit is controlled by the write data determination circuit.

11. The semiconductor memory device of claim 1, further comprising:
a write data determination circuit configured to determine whether or not write data is the same as data stored in the representative value storage circuit,
wherein the power supply control circuit is controlled by the write data determination circuit.

12. The semiconductor memory device of claim 1, wherein the predetermined control signal is activated during a non-operating cycle of the semiconductor memory device.

13. The semiconductor memory device of claim 1, wherein the match detection circuit uses a read circuit.

* * * * *